(12) United States Patent
Lee

(10) Patent No.: US 7,304,892 B2
(45) Date of Patent: *Dec. 4, 2007

(54) FLASH MEMORY DEVICE AND METHOD FOR CONTROLLING ERASE OPERATION OF THE SAME

(75) Inventor: Hee Youl Lee, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,356

(22) Filed: Nov. 6, 2006

(65) Prior Publication Data

US 2007/0121388 A1 May 31, 2007

Related U.S. Application Data

(63) Continuation-in-part of application No. 11/160,278, filed on Jun. 16, 2005, now Pat. No. 7,200,039.

(51) Int. Cl.
*G11C 16/04* (2006.01)

(52) U.S. Cl. .......................... 365/185.18; 365/185.28; 365/189.09

(58) Field of Classification Search ........... 365/185.18, 365/185.2, 185.28, 185.29, 189.09
See application file for complete search history.

(56) References Cited

U.S. PATENT DOCUMENTS

| | | | | |
|---|---|---|---|---|
| 5,818,758 A | * | 10/1998 | Wojciechowski | ...... 365/185.18 |
| 5,991,198 A | * | 11/1999 | Song et al. | ............. 365/185.11 |
| 6,327,194 B1 | * | 12/2001 | Kurihara et al. | ....... 365/189.09 |
| 6,335,882 B1 | * | 1/2002 | Saeki et al. | ............. 365/185.29 |
| 7,200,039 B2 | * | 4/2007 | Lee | ........................ 365/185.18 |
| 2006/0044877 A1 | * | 3/2006 | Kato | ...................... 365/185.29 |
| 2006/0268653 A1 | * | 11/2006 | Umezawa | .............. 365/230.06 |

* cited by examiner

*Primary Examiner*—Gene N. Auduong
(74) *Attorney, Agent, or Firm*—Townsend & Townsend & Crew LLP

(57) ABSTRACT

A non-volatile memory device includes first and second memory cell blocks, each including a plurality of memory cells and including a local drain select line, a local source select line, and local word lines. A block selection unit connects given local word lines to global word line, respectively, in response to a block selection signal. A first bias voltage generator is configured to apply at least first and second erase voltages to the global word lines during an erase operation, the first erase voltage being applied to the global word lines during a first erase attempt of the erase operation, the second erase voltage being applied to the global word lines during a second erase attempt, where the second erase attempt is performed if the first erase attempt did not successfully perform the erase operation. The first and second erase voltages being positive voltages. A bulk voltage generator applies a bulk voltage to a bulk of the memory cells during the erase operation.

33 Claims, 11 Drawing Sheets

GK1

FLASH MEMORY DEVICE AND METHOD FOR CONTROLLING ERASE OPERATION OF THE SAME

CROSS REFERENCE TO RELATED APPLICATIONS

This application is a CIP of 11/160,278, filed Jun. 16, 2005 now U.S. Pat. No. 7,200,039.

BACKGROUND OF THE INVENTION

The present invention relates to semiconductor memory devices, and more specifically, to a flash memory device, in which it can prevent the reliability of an erase operation from being lowered due to a leakage current in an erase operation on a block basis, and a method of controlling an erase operation of the same.

Generally, flash memory devices can be classified into a NOR type, which is generally used to store a small quantity of information at high speed, and a NAND type, which is generally used to store a great amount of information. The flash memory device performs a read operation, a program operation and an erase operation. The terms "program operation" and "erase operation" refer to operations relating to data storage in one or more memory cells by injecting/removing electrons into/from the floating gates. For example, in the program operation, only selected ones of a plurality of memory cells included in a memory cell block are programmed. The erase operation of the flash memory device is executed as electrons existing in the floating gate of the memory cell are discharged toward the P-well by means of FN tunneling. In the erase operation, data stored in the entire memory cells included in the memory cell block are erased at the same time. That is, the erase operation is performed on the basis of a memory cell block.

FIG. 1 is a circuit diagram of memory cells and pass gates for explaining the erase operation of a conventional flash memory device. In an erase operation, a bias voltage Vb of 0V is applied to a global word line GWL, and a bulk voltage VBK1 of 20V is applied to P-wells of memory cells CA1 to CAn and CB1 to CBn (where n is an integer). Sources and drains of the memory cells CA1 to CAn and CB1 to CBn are floated. In addition, to a gate of a NMOS transistor NM1 connected between a local word line WL1 of a memory cell block A, which is selected (i.e., which will be erased), and to the global word line GWL is applied a block select signal BKSEL1 of a voltage (Vcc) level. To a substrate (not shown) of the NMOS transistor NM1 is applied a bulk voltage VBK2 of 0V. The NMOS transistor NM1 is turned on in response to the block select signal BKSEL1, and the local word line WL1 is connected to the global word line GWL. As a result, a voltage of the local word line WL1 becomes 0V, and a voltage difference of 20V is generated between control gates (not shown) of the memory cells CA1 to CAn connected to the local word line WL1 and the P-wells of the memory cells CA1 to CAn. Accordingly, as electrons of the floating gates of the memory cells CA1 to CAn are discharged toward the P-wells, the erase operation of the memory cell block A is performed.

Meanwhile, a gate of an NMOS transistor NM2 connected between a local word line WL2 of a memory cell block B, which is not selected (i.e., which will not be erased), and the global word line GWL is applied with a block select signal BKSEL2 of 0V. In addition, to a substrate of the NMOS transistor NM2 is applied a bulk voltage VBK2 of 0V. The NMOS transistor NM2 is turned off in response to the block select signal BKSEL2, and the local word line WL2 is separated from the global word line GWL. This floats the local word line WL2 floated. Thereafter, the bulk voltage VBK1 of 20V, which is applied to the P-wells of the memory cells CB1 to CBn, is applied to the local word line WL2 by means of a capacitive coupling phenomenon, and a voltage level of the local word line WL2 is boosted to about 19V accordingly. This results in a voltage difference of 1 V between the local word line WL2 and the P-wells of the memory cells CB1 to CBn that is not sufficient to discharge electrons from the floating gates of the memory cells CB1 to CBn. As a result, while the erase operation is performed on the memory cell block A, the erase operation is not performed on the memory cell block B.

Although the NMOS transistor NM2 is turned off, the leakage current can be generated in the NMOS transistor NM2. Accordingly, the voltage level of the local word line WL2, which is boosted to the voltage level close to the bulk voltage VBK1, can gradually decrease. This leads to an increase in the voltage difference between the control gates and the P-wells of the memory cells CB1 to CBn. Therefore, a shallow erase may result, i.e., a small amount of electrons may be discharged unintentionally from floating gates of memory cells CB1 to CBn. Erase disturbance, such as shallow erase, becomes more significant when the number of memory cell blocks included in a flash memory device increases. For example, whenever memory cell blocks perform an erase operation one by one, a shallow erase phenomenon is repeatedly generated in memory cells of memory cell blocks that should not be erased. Consequently, as the threshold voltages of corresponding memory cells gradually decrease, the read operation failure is likely to increase.

Furthermore, there occurs a fast program phenomenon in which as the number of an erase operation is increased, the threshold voltage rises above a target voltage at the time of a program operation, or a slow erase phenomenon in which the threshold voltage is not sufficiently lowered to a target voltage at the time of an erase operation. This will be described in more detail below with reference to FIG. 2.

FIG. 2 is a characteristic graph showing a slow erase characteristic and a fast program characteristic depending on the number of an erase operation in the prior art. Although the program or erase operation is performed under the same condition, the threshold voltage of a memory cell increases as the program or erase operation is carried out and eventually becomes higher than a target voltage. The increase in the threshold voltage results in the program operation being performed fast or the erase operation being performed slowly. This phenomenon occurs when a voltage difference between the word lines and the bulk at the time of the erase operation is high. In other words, the higher the voltage difference between the word lines and the bulk at the time of the erase operation, the more severe the fast program and slow erase phenomena.

FIG. 3 is a characteristic graph showing a slow erase characteristic and a fast program characteristic depending on the level of an erase voltage in the prior art. It can be seen that if the erase operation is performed when the voltage difference between the word lines and the bulk is high (high potential erase), the fast program phenomenon and the slow erase phenomenon are generated sharply, whereas if the erase operation is performed when the voltage difference between the word lines and the bulk is low (low potential erase), the fast program phenomenon and the slow erase phenomenon are generated more gradually.

To prevent the occurrence of the fast program phenomenon and the slow erase phenomenon as described above, the erase operation should be performed with the voltage difference between the word lines and the bulk being low. In this case, however, an erase operation time may be lengthened and the erase operation may be performed improperly. If the erase operation is performed improperly, corresponding blocks may be flagged as invalid blocks that are not to be used. This reduces the number of available blocks and decreases the data storage capacity.

SUMMARY

Accordingly, embodiments of the present invention relate to an operation wherein electrons are discharged from the floating gates of the memory cells, e.g., erase operation. The erase operation of the present embodiments is performed to reduce leakage current of memory cells that are not selected for the erase operation. In one embodiment, a first positive voltage is applied to global word lines during an erase operation (a first attempt). If the erase operation has not been performed properly, the erase operation is performed again (a second attempt) by applying a second voltage that is less than the first voltage to the global word lines. The erase attempt is repeated for a predetermined number of times or until the erase operation has been performed successfully, whichever occurs first. The voltage applied to the global word lines is reduced after each failed attempt to increase the voltage difference for the erase operation.

In one embodiment, a non-volatile memory device includes first and second memory cell blocks, each including a plurality of memory cells and including a local drain select line, a local source select line, and local word lines. A block selection unit connects a given local word lines to global word lines, respectively, in response to a block selection signal. A first bias voltage generator is configured to apply at least first and second erase voltages to the global word lines during an erase operation, the first erase voltage being applied to the global word lines during a first erase attempt of the erase operation, the second erase voltage being applied to the global word lines during a second erase attempt, where the second erase attempt is performed if the first erase attempt did not successfully perform the erase operation. The first and second erase voltages being positive voltages. A bulk voltage generator applies a bulk voltage to a bulk of the memory cells during the erase operation. In this embodiment, an erase voltage applied to the global word lines is reduced by a given voltage each time a new erase attempt is made, wherein a given erase operation is stopped after a predetermined number of unsuccessful erase attempts.

In one embodiment, a flash memory device includes memory cell blocks each respectively including a local drain select line, a local source select line, and local word lines to which a plurality of memory cells are connected. A block selection unit connects the local word lines to global word lines, respectively, in response to a block selection signal. A first bias voltage generator applies a positive erase voltage to the global word lines at the time of an erase operation. A bulk voltage generator is configured to apply a first bulk voltage to a bulk of the memory cells during a first erase attempt of the erase operation, and apply a second bulk voltage to the bulk during a second erase attempt if the first erase attempt has not been performed properly. The first erase attempt is considered to have not been performed properly if not all of the memory cells selected for the erase operation have been erased by the first erase attempt.

In one embodiment, a method of erasing a non-volatile memory device includes connecting local word lines and global word lines of a selected block in response to a block selection signal. A first erase attempt of an erase operation is performed by applying a first erase voltage to the global word lines and a first bulk voltage higher than the first erase voltage to a bulk, so that a voltage difference between the local word lines and the bulk is a first potential difference. The method further includes determining whether the first erase attempt has been performed properly. A second erase attempt of the erase operation is performed if it is determined that the first erase attempt has not been performed properly. The second erase attempt involves applying a second erase voltage to the global word lines and a second bulk voltage to the bulk to increase the voltage difference between the local word lines and the bulk to a second potential difference. The second erase voltage may be less than the first erase voltage. The second bulk voltage may be greater than the first bulk voltage. The first erase voltage and the second erase voltage may be different, and the first bulk voltage and the second bulk voltage may be different.

A flash memory device according to a first embodiment of the present invention includes memory cell blocks, a block selection unit, a first bias voltage generator, and a bulk voltage generator. Each of the memory cell blocks includes a local drain select line, a local source select line, and local word lines to which a plurality of memory cells are connected. The block selection unit connects the local word lines to global word lines, respectively, in response to a block selection signal. The first bias voltage generator applies a positive erase voltage to the global word lines at the time of an erase operation, and if there exists a memory cell that has not been erased, decreases the erase voltage and applies a lowered erase voltage to the global word lines in order to perform the erase operation again. The bulk voltage generator applies a bulk voltage to a bulk of the memory cells at the time of the erase operation.

The first bias voltage generator may generate the erase voltage so that a voltage difference between the local word lines and the bulk becomes 15 V at the time of an initial erase operation, and decrease the erase voltage so that the voltage difference between the local word lines and the bulk becomes higher than 15 V when the erase operation is performed again. At this time, the first bias voltage generator may decrease the erase voltage on a 0.1 to 0.5 V basis as a linear function, as a quadratic function or as an exponential function.

The flash memory device may further include a page buffer for reading data stored in the memory cells, and a Y-decoder for outputting data stored in the page buffer to a data I/O buffer and the first bias voltage generator.

The first bias voltage generator may decrease the erase voltage in order to perform the erase operation again if data that have not been erased, of the data output from the Y-decoder, are detected.

A flash memory device according to a second embodiment of the present invention includes memory cell blocks, a block selection unit, a first bias voltage generator, and a bulk voltage generator. Each of the memory cell blocks includes a local drain select line, a local source select line, and local word lines to which a plurality of memory cells are connected. The block selection unit connects the local word lines to global word lines, respectively, in response to a block selection signal. The first bias voltage generator applies a positive erase voltage to the global word lines at the time of an erase operation. The bulk voltage generator applies a bulk voltage to a bulk of the memory cells at the time of the erase operation, and if there exists a memory cell that has not been erased, increases the bulk voltage and applies an increased bulk voltage to the bulk for the purpose of the re-execution of the erase operation again.

The bulk voltage generator may generate the bulk voltage so that a voltage difference between the local word lines and the bulk becomes 15 V at the time of an initial erase operation, and decrease the bulk voltage so that the voltage difference between the local word lines and the bulk becomes higher than 15 V when the erase operation is performed again. At this time, the bulk voltage generator may increase the bulk voltage on a 0.5 to 1 V basis as a linear function, as a quadratic function or as an exponential function.

The flash memory device may further include a page buffer for reading data stored in the memory cells, and a Y-decoder for outputting data stored in the page buffer to a data I/O buffer and the bulk voltage generator.

The bulk voltage generator may increase the bulk voltage in order to perform the erase operation again if data that have not been erased, of the data output from the Y-decoder, are detected.

A flash memory device according to a third embodiment of the present invention includes memory cell blocks, a block selection unit, a first bias voltage generator, and a bulk voltage generator. Each of the memory cell blocks includes a local drain select line, a local source select line, and local word lines to which a plurality of memory cells are connected. The block selection unit connects the local word lines to global word lines, respectively, in response to a block selection signal. The first bias voltage generator applies a positive erase voltage to the global word lines at the time of an erase operation, and if there exists a memory cell that has not been erased, decreases the erase voltage and applies a lowered erase voltage to the global word lines in order to perform the erase operation again. The bulk voltage generator applies a bulk voltage to a bulk of the memory cells at the time of the erase operation, and if there exists a memory cell that has not been erased, increases the bulk voltage and applies an increased bulk voltage to the bulk for the purpose of the re-execution of the erase operation again.

In the above, at the time of an initial erase operation, the first bias voltage generator and the bulk voltage generator may generate the erase voltage and the bulk voltage, respectively, so that a voltage difference between the local word lines and the bulk becomes 15 V. When the erase operation is performed again, the bulk voltage generator may increase the bulk voltage and the first bias voltage generator may decrease the erase voltage so that the voltage difference between the local word lines and the bulk becomes higher than 15 V. At this time, the first bias voltage generator may decrease the erase voltage on a 0.1 to 0.5 V basis as a linear function, as a quadratic function or as an exponential function. The bulk voltage generator may increase the bulk voltage on a 0.5 to 1 V basis as a linear function, as a quadratic function or as an exponential function.

The flash memory device may further include a page buffer for reading data stored in the memory cells, and a Y-decoder for outputting data stored in the page buffer to a data I/O buffer, the bulk voltage generator, and the first bias voltage generator.

Meanwhile, if data that have not been erased, of the data output from the Y-decoder, are detected, the first bias voltage generator decreases the erase voltage and the bulk voltage generator increases the bulk voltage in order to perform the erase operation again.

The flash memory device may further include an X-decoder for decoding a row address signal and outputting the block selection signal to the high voltage generating unit. Furthermore, the flash memory device may further include a second bias voltage generator for applying a predetermined operating voltage to the local drain select line and the local source select line according to any one of program, read, and erase operations.

The first bias voltage generator may include a first pump circuit for generating read voltages necessary for a read operation in response to a read command, a second pump circuit for generating program voltages necessary for a program operation in response to a program command, a third pump circuit for generating the erase voltage in response to an erase command, and if data that have not been erased, of the data output from the Y-decoder, are detected, decreasing the erase voltage and outputting a decreased erase voltage, and a bias voltage selection unit for selecting the read voltages, the program voltages or the erase voltage in response to an operation command signal, and outputting a selected voltage to the global word lines, respectively. At this time, the bias voltage selection unit may include a select signal generator for generating select signals based on the operation command signal, and select circuits respectively connected to the global word lines, for outputting one of the read voltages, the program voltages, and the erase voltage to the global word lines, respectively, in response to the select signals.

According to a first embodiment of the present invention, there is provided a method of controlling an erase operation of a flash memory device, including the steps of (a) electrically connecting local word lines and global word lines of a selected block, respectively, in response to a block selection signal, (b) performing an erase operation by applying a positive erase voltage to the global word lines and a bulk voltage higher than the erase voltage to a bulk of a memory cell according to an erase command, (c) determining whether the erase operation has been performed properly, and (d) if it is determined that the erase operation has not been performed properly, performing the erase operation again by decreasing the erase voltage so that a voltage difference between the local word lines and the bulk becomes great.

The steps (c) and (d) may be repeatedly performed as many as the number of times while decreasing the erase voltage as much as a predetermined level, and include treating a corresponding block as an invalid block if the erase operation has not been performed properly until the predetermined number.

According to a second embodiment of the present invention, there is provided a method of controlling an erase operation of a flash memory device, including the steps of (a) electrically connecting local word lines and global word lines of a selected block, respectively, in response to a block selection signal, (b) performing an erase operation by applying a positive erase voltage to the global word lines and a bulk voltage higher than the erase voltage to a bulk of a memory cell according to an erase command, (c) determining whether the erase operation has been performed properly, and (d) if it is determined that the erase operation has not been performed properly, performing the erase operation again by increasing the erase voltage so that a voltage difference between the local word lines and the bulk becomes great.

The steps (c) and (d) may be repeatedly performed as many as the number of times while increasing the erase voltage as much as a predetermined level, and include treating a corresponding block as an invalid block if the erase operation has not been performed properly until the predetermined number.

According to a third embodiment of the present invention, there is provided a method of controlling an erase operation of a flash memory device, including the steps of (a) electrically connecting local word lines and global word lines of a selected block, respectively, in response to a block selection signal, (b) performing an erase operation by applying a positive erase voltage to the global word lines and a bulk voltage higher than the erase voltage to a bulk of a memory cell according to an erase command, (c) determining whether the erase operation has been performed properly, and (d) if it is determined that the erase operation has not been performed properly, performing the erase operation again by controlling the erase voltage and the bull voltage at the same time so that a voltage difference between the local word lines and the bulk becomes great.

The steps (c) and (d) may be repeatedly performed as many as the number of times while the erase voltage is decreased as much as a predetermined level and the bulk voltage is increased as much as a predetermined level, and include treating a corresponding block as an invalid block if the erase operation has not been performed properly until the predetermined number.

Furthermore, the erase voltage and the bulk voltage may be set such that a voltage difference between the local word lines and the bulk is 15 V or higher.

The erase voltage may be decreased on a 0.1 to 0.5 V basis so that a voltage difference between the local word lines and the bulk is increased within a range in which the voltage difference becomes at least 15 V, or may be decreased as an exponential function so that a voltage difference between the local word lines and the bulk is increased within a range in which the voltage difference becomes at least 15 V.

The erase voltage may be increased on a 0.5 to 1 V basis so that a voltage difference between the local word lines and the bulk is increased within a range in which the voltage difference becomes at least 15 V, or may be increased as an exponential function so that a voltage difference between the local word lines and the bulk is increased within a range in which the voltage difference becomes at least 15 V.

DESCRIPTION OF SPECIFIC EMBODIMENTS

Now, the various embodiments according to the present invention will be described with reference to the accompanying drawings. Because various embodiments are provided for the purpose that the ordinary persons skilled in the art are able to understand the present invention, they may be modified in various manners and the scope of the present invention is not limited by the various embodiments described later.

Figure 4:
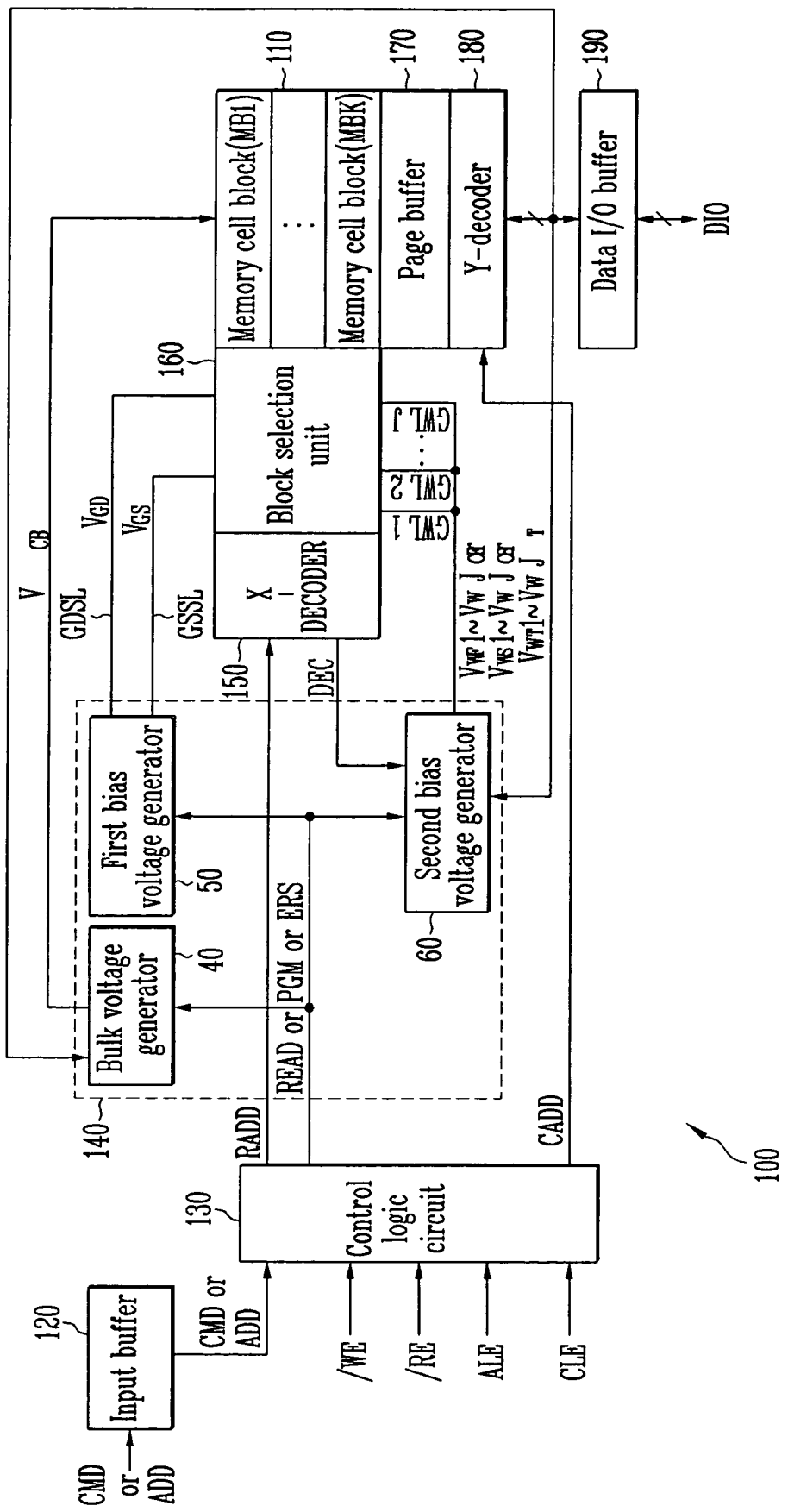
FIG. 4 is a block diagram of a flash memory device according to an embodiment of the present invention.

FIG. 4 is a block diagram of a flash memory device according to an embodiment of the present invention. A flash memory device 100 includes a memory cell array 110, an input buffer 120, a control logic circuit 130, a high voltage generator 140, an X-decoder 150, a block selection unit 160, a page buffer 170, a Y-decoder 180 and a data I/O buffer 190. The memory cell array 110 includes memory cell blocks MB1 to MBK (where K is an integer), each having a plurality of memory cells (not shown). The input buffer 120 receives a command signal CMD or an address signal ADD, and outputs them to the control logic circuit 130. The control logic circuit 130 receives the command signal CMD or the address signal ADD in response to external control signals /WE, /RE, ALE and CLE. The control logic circuit 130 generates one of a read command READ, a program command PGM and an erase command ERS in response to the command signal CM1. The control logic circuit 130 generates a row address signal RADD and a column address signal CADD in response to the address signal ADD.

The high voltage generator 140 includes a bulk voltage generator 40, a first bias voltage generator 50 and a second bias voltage generator 60. The bulk voltage generator 40 generates a bulk voltage $V_{CB}$ in response the read command READ, the program command PGM and the erase command ERS, and supplies the bulk voltage $V_{CB}$ to P-wells of the memory cells. More particularly, the bulk voltage generator 40 generates the bulk voltage $V_{CB}$ of a low voltage (for example, 0V) level in response to the read command READ or the program command PGM. The bulk voltage generator 40 also generates the bulk voltage $V_{CB}$ of a high voltage (for example, 20V) level in response to the erase command ERS. Meanwhile, if there are cells on which the erase operation has not been performed properly according to data output from the Y-decoder 180 after the erase operation, the level of the bulk voltage $V_{CB}$ may be controlled. For example, if the erase operation has not been performed properly, the level of the bulk voltage $V_{CB}$ may be increased on a 0.5V or 1V basis and the increase width of the bulk voltage $V_{CB}$ may be changed, if appropriate.

The first bias voltage generator 50 generates a drain bias voltage $V_{GD}$ and a source bias voltage $V_{GS}$ in response to one of the read command READ, the program command PGM and the erase command ERS, and supplies the drain bias voltage $V_{GD}$ to a global drain select line GDSL and the source bias voltage $V_{GS}$ to a global source select line GSSL. More particularly, the first bias voltage generator 50 generates the drain bias voltage $V_{GD}$ and the source bias voltage $V_{GS}$ of a high voltage (for example, 4.5V) level in response to the read command READ. The first bias voltage generator 50 also generates the drain bias voltage $V_{GD}$ of an internal voltage (VCC, not shown) level and the source bias voltage $V_{GS}$ of a low voltage level in response to the program command PGM. Furthermore, the first bias voltage generator 50 generates the drain bias voltage $V_{GD}$ and the source bias voltage $V_{GS}$ of a low voltage level in response to the erase command ERS.

The second bias voltage generator 60 generates word line bias voltages $V_{WF}1$ to $V_{WF}J$ (where J is an integer), word line bias voltages $V_{WS}1$ to $V_{WS}J$ (where J s an integer) or word line bias voltages $V_{WT}1$ to $V_{WT}J$ (where J is an integer) in response to one of the read command READ, the program command PGM, and the erase command ERS, and a decoded signal DEC, and supplies the generated word line bias voltages to global word lines GWL1 to GWLJ (where J is an integer). In more detail, the second bias voltage generator 60 generates the word line bias voltages $V_{WF}1$ to $V_{WF}J$ in response to the read command READ. The second bias voltage generator 60 generates the word line bias voltages $V_{WS}1$ to $V_{WS}J$ in response to the program command PGM. The second bias voltage generator 60 generates the word line bias voltages $V_{WT}1$ to $V_{WT}J$ in response to the erase command ERS.

In this case, the second bias voltage generator 60 generates a positive voltage higher than 0 V when the erase command ERS is input. After the erase operation, the second bias voltage generator 60 controls the levels of the word line bias voltages $V_{WT}1$ to $V_{WT}J$ if there are cells on which the erase operation has not been performed properly according to data output from the Y-decoder 180. For example, if the erase operation has not been performed properly, the second bias voltage generator 60 may lower the levels of the word line bias voltages $V_{WT}1$ to $V_{WT}J$ on a 0.1V to 0.5V basis and output the lowered word line bias voltages. The decrease width of the word line bias voltages $V_{WT}1$ to $V_{WT}J$ may be changed, if needed.

If the erase operation has not been performed properly, the bulk voltage generator 40 and the second word line voltage generator 60 control the output voltage. This is to perform the erase operation again (i.e., to perform a re-erase operation). The re-erase operation is performed by increasing a voltage difference between the word lines and the bulk. In order to increase the voltage difference between the word lines and the bulk, only one of the bulk voltage generator 40 and the second word line voltage generator 60, or both the bulk voltage generator 40 and the second word line voltage generator 60 may control the level of the output voltage. This will be described in detail later on.

The X-decoder 150 decodes the row address signal RADD, and outputs a decoded signal DEC. The block selection unit 160 selects one or more of the memory cell blocks MB1 to MBK in response to the decoded signal DEC, and connects local word lines WL11 to WL1J (See FIG. 5) of a selected memory cell block (or a memory cell block) to the global word lines GWL1 to GWLJ, respectively. The block selection unit 160 connects one of drain select lines DSL1 to DSLK (See FIG. 5) of the selected memory cell block to the global drain select line GDSL, and connects one of source select lines SSL1 to SSLK (See FIG. 5) of the selected memory cell block to the global source select line GSSL. The construction and operation of the page buffer 170, the Y-decoder 180 and the data I/O buffer 190 are known by those skilled in the art, and the description thereof are omitted.

Figure 5:
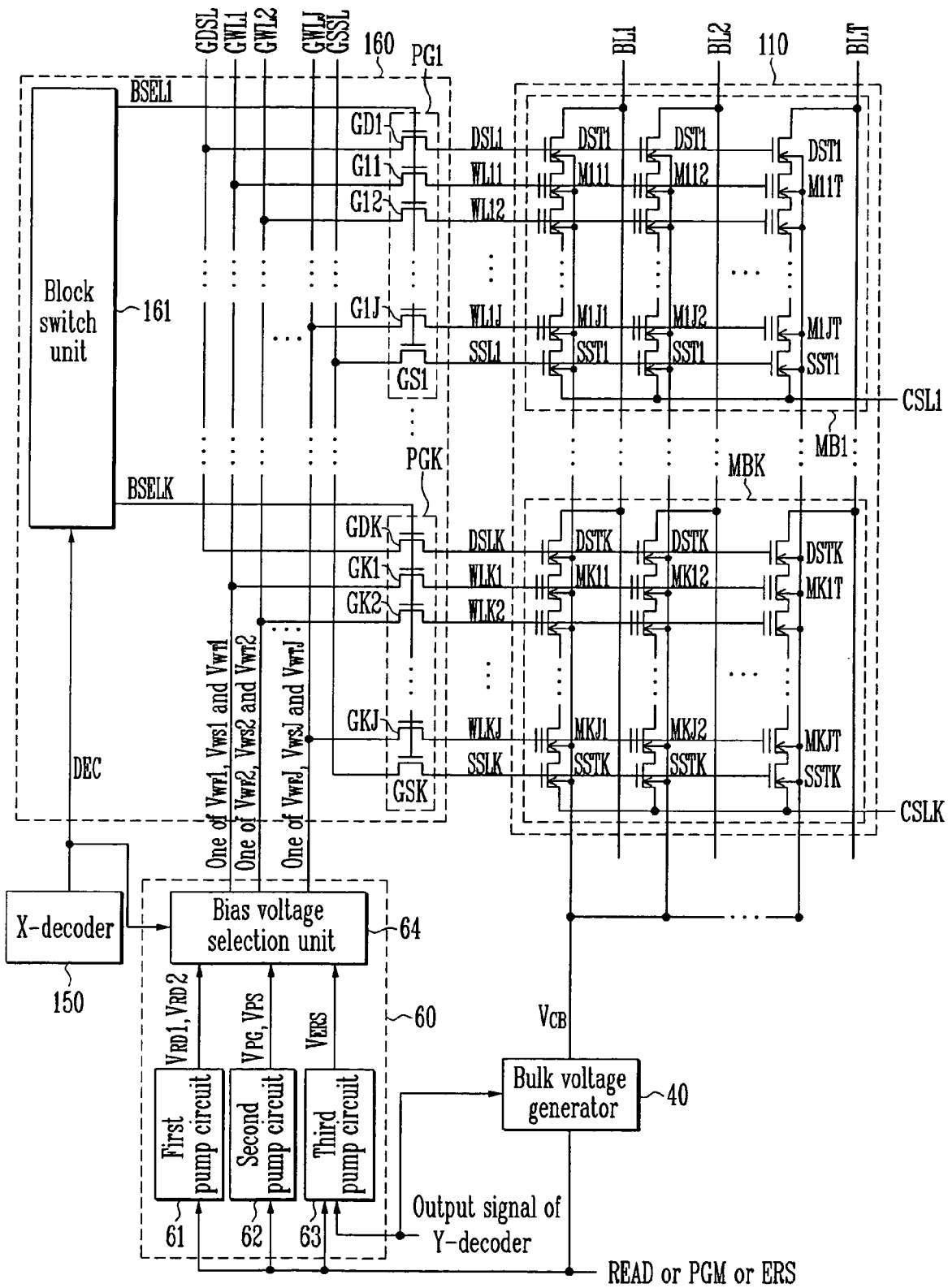
FIG. 5 is a detailed circuit diagram of a memory cell array, a block selection unit, a second bias voltage generator, a bulk voltage generator and an X-decoder shown in FIG. 4.

FIG. 5 is a detailed circuit diagram of the memory cell array, the block selection unit, the second bias voltage generator, the bulk voltage generator and the X-decoder shown in FIG. 4. The memory cell block MB1 of the memory cell array 110 includes memory cells M111 to M1JT (where J and T are integers), a drain select transistor DST1 and a source select transistor SST1. The memory cells M111 to M1JT share bit lines BL1 to BLT (where T is an integer), local word lines WL11 to WL1J (where J is an integer), and a common source line CSL1. That is, the memory cells M111 to M11T are connected to the bit lines BL1 to BLT, respectively, through the drain select transistor(s) DST1, and the memory cells M1J1 to M1JT are connected to the common source line CSL1 through the source select transistor(s) SST1. In addition, gates of the memory cells M111 to M1JT are connected to the local word lines WL11 to WL1J. A gate(s) of the drain select transistor(s) DST1 is connected to the local drain select line DSL1, and a gate(s) of the source select transistor(s) SST1 is connected to a local source select line SSL1.

The construction of the memory cell blocks MB2 to MBK of the memory cell array 110 is the same as that of the memory cell block MB1. The block selection unit 160 includes a block switch unit 161 and a plurality of switching units PG1 to PGK (where K is an integer). The block switch unit 161 outputs block select signals BSEL1 to BSELK (where K is an integer) in response to the decoded signal DEC received from the X-decoder 150. The plurality of switching units PG1 to PGK are disposed corresponding to the memory cell blocks MB1 to MBK, respectively, and are enabled or disabled in response to the block select signals BSEL1 to BSELK.

Each of the plurality of switching units PG1 to PGK includes a plurality of switching elements. For example, the switching unit PG1 has switching elements GD1, G11 to G1J, and GS1. The construction and operation of the switching units PG2 to PGK are similar to those of the switching unit PG1. Thus, description will be given on the basis of the operation of the switching unit PG1. Preferably, the switching elements GD1, G11 to G1J, and GS1 can be implemented using NMOS transistors. Hereinafter, the switching elements GD1, G11 to G1J, and GS1 will be referred to as the "NMOS transistors" for illustrative convenience. The block select signal BSEL1 is input to the gates of the NMOS transistors GD1, G11 to G1J, and GS1. The NMOS transistor GD1 has a source connected to the global drain select line GDSL, and a drain connected to the local drain select line DSL1. The NMOS transistors G11 to G1J have sources connected to the global word lines GWL1 to GWLJ, respectively, and drains connected to the local word lines WL11 to WL1J, respectively. The NMOS transistor GS1 has a source connected to the global source select line GSSL, and a drain connected to the local source select line SSL1. The NMOS transistors GD1, G11 to G1J, and GS1 are turned on or off at the same time in response to the block select signal BSEL1.

More particularly, when the block select signal BSEL1 is enabled, the NMOS transistors GD1, G11 to G1J, and GS1 are turned on, and when the block select signal BSEL1 is disabled, the NMOS transistors GD1, G11 to G1J, and GS1 are turned off. When the NMOS transistors GD1, G11 to G1J, and GS1 are turned on, the global drain select line GDSL is connected to the local drain select line DSL1, the global source select line GSSL is connected to the local source select line SSL1, and the global word lines GWL1 to GWLJ are connected to the local word lines WL11 to WL1J, respectively.

The second bias voltage generator 60 includes first to third pump circuits 61, 62 and 63, and a bias voltage selection unit 64. The first pump circuit 61 generates read voltages $V_{RD}1$ and $V_{RD}2$ in response to the read command READ. Preferably, the read voltage $V_{RD}1$ has a high voltage (for example, 4.5V) level, and the read voltage $V_{RD}2$ has a low voltage (for example, 0V) level. In a read operation of the memory cell array 110, the read voltage $V_{RD}1$ is applied to local word lines to which gates of non-selected memory cells (i.e., memory cells that will not be read) are connected, and the read voltage $V_{RD}2$ is applied to local word lines to which gates of selected memory cells (i.e., memory cells to be read) are connected.

The second pump circuit 62 generates program voltages $V_{PG}$ and $V_{PS}$ in response to the program command PGM. Preferably, the program voltages $V_{PG}$ and $V_{PS}$ have high voltage levels (for example, $V_{PG}$=18V, $V_{PS}$=10V), respectively. In a program operation of the memory cell array 110, the program voltage $V_{PG}$ is applied to local word lines to which gates of memory cells to be programmed are connected, and the program (or pass) voltage $V_{PS}$ is applied to local word lines to which gates of memory cells that will not be programmed are connected.

Furthermore, the third pump circuit 63 generates a positive erase voltage $V_{ERS}$, which is higher than 0 V in response to the erase command ERS. In other words, the third pump circuit 63 generates the erase voltage $V_{ERS}$ so that a voltage higher than 0 V is applied to word lines of a block selected at the time of an erase operation. At this time, in a block on which the erase operation is performed according to the positive erase voltage $V_{ERS}$, a voltage difference between word lines and a bulk is lowered. It is preferred that the erase voltage $V_{ERS}$ be generated at a level of the extent that the voltage difference between the word lines and the bulk is about 15 to 20 V in the block on which the erase operation is performed.

Meanwhile, if data of a non-erase state (for example, 0), of data output from the Y-decoder (refer to numeral 180 in FIG. 4), are detected (i.e., the erase operation has failed) in the operation of determining whether the erase operation has been performed properly, the third pump circuit 63 may decrease the level of the erase voltage $V_{ERS}$ on a 0.1 to 0.5 V basis and output a decreased erase voltage $V_{ERS}$. The decrease width of the erase voltage $V_{ERS}$ may be changed, if appropriate. [WHAT DO YOU MENA BY DECREASE WIDTH?] The erase voltage $V_{ERS}$ may be decreased as a linear function, a quadratic function or an exponential function. Accordingly, the voltage difference between the word lines and the bulk is increased and the erase operation is performed again according to the increased voltage difference.

The bias voltage selection unit 64 selects the read voltages $V_{RD}1$ and $V_{RD}2$ in response to the decoded signal DEC received from the X-decoder 150 and then outputs the selected read voltages $V_{RD}1$ and $V_{RD}2$ to the global word lines GWL1 to GWLJ, respectively, as the word line bias voltages $V_{WF}1$ to $V_{WF}J$, selects the program voltages $V_{PG}$ and $V_{PS}$ and then outputs the selected program voltages $V_{PG}$ and $V_{PS}$ to the global word lines GWL1 to GWLJ, respectively, as word line bias voltages $V_{WS}1$ to $V_{WS}J$ (where J is an integer), or selects the erase voltage $V_{ERS}$ and then outputs the selected erase voltage $V_{ERS}$ to the global word lines GWL1 to GWLJ as word line bias voltages $V_{WT}1$ to $V_{WT}J$.

The bulk voltage generator 40 generates a high bulk voltage $V_{CB}$, which will be applied to a bulk (for example, a P well) in which the memory cells M111 to M1JT (J and T are integers) are formed at the time of an erase operation in response to the erase command ERS. The bulk voltage $V_{CB}$ may be generated at a voltage level of the extent that the voltage difference between the word lines and the bulk is 15 to 20 V in a block on which the erase operation is performed.

Meanwhile, if data of a non-erase state (for example, 0), of data output from the Y-decoder (refer to 180 in FIG. 4), are detected (i.e., the erase operation has failed) in the operation of determining whether the erase operation has been performed properly, the bulk voltage generator 40 may increase the level of the bulk voltage $V_{CB}$ on a 0.5 to 1 V basis and output an increased bulk voltage $V_{CB}$. The increase width of the bulk voltage $V_{CB}$ may be changed, if appropriate. The bulk voltage $V_{CB}$ may be increased as a linear function, a quadratic function or an exponential function. Accordingly, the voltage difference between the word lines and the bulk is increased and the erase operation is performed again according to the increased voltage difference.

As described above, the erase operation is performed in a state where the global word lines are applied with a positive voltage. If the erase operation is not performed properly, the erase operation is performed again by controlling an output voltage of one of or both the third pump circuit 63 and the bulk voltage generator 40 so that a voltage difference between the word lines and the bulk is increased. The output voltage of the third pump circuit 63 or the bulk voltage generator 40 may be controlled such that the voltage difference between the word lines and the bulk is 15 V or more.

Figure 6:
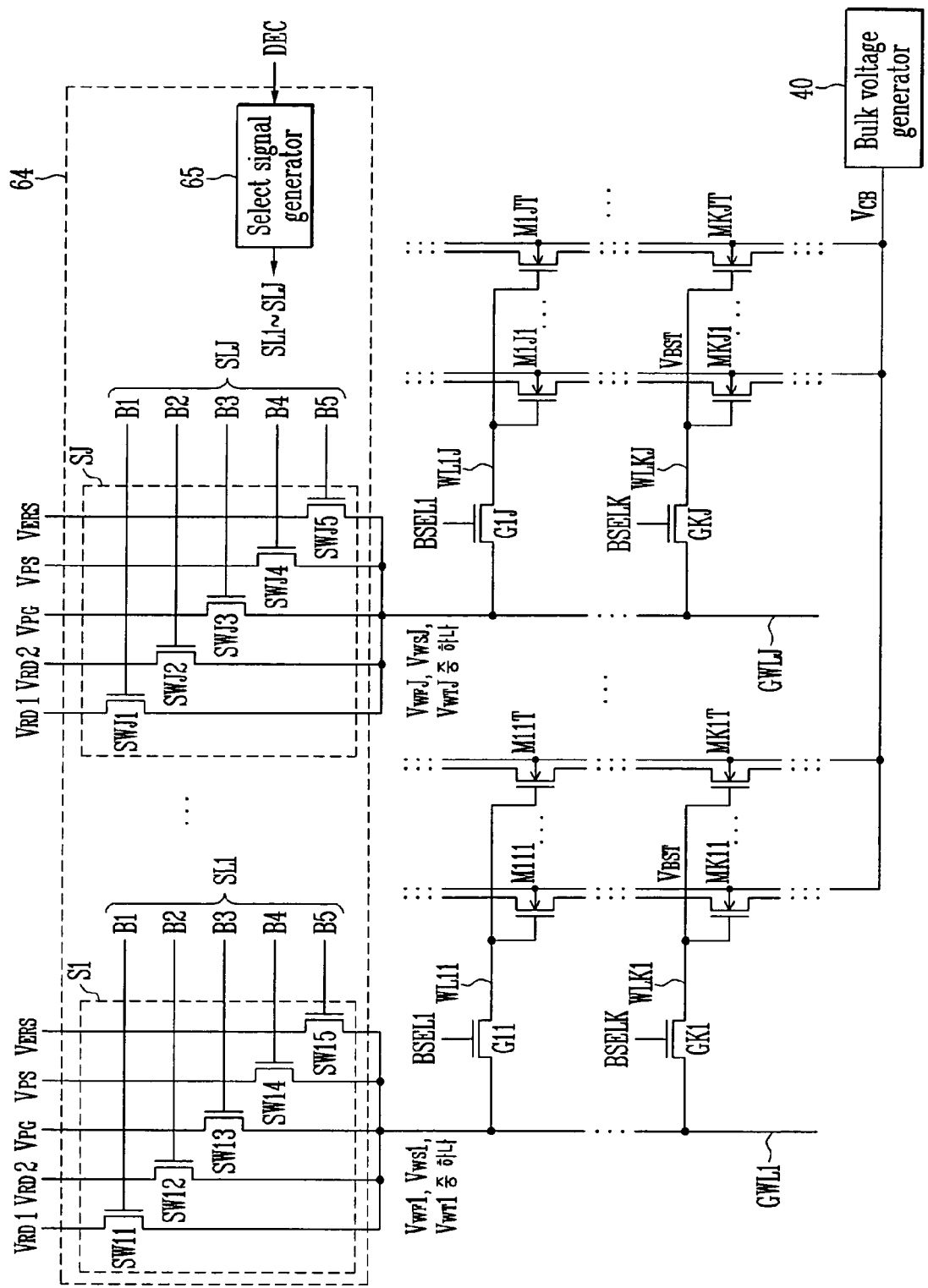
FIG. 6 is a detailed circuit diagram of memory cells, pass gates, a bulk voltage generator and a bias voltage selection unit shown in FIG. 5.

FIG. 6 is a detailed circuit diagram of the memory cells, the pass gates, the bulk voltage generator and the bias voltage selection unit shown in FIG. 5.

Referring to FIG. 6, the bias voltage selection unit 64 includes a select signal generator 65, and select circuits S1 to SJ (where J is an integer). The select signal generator 65 generates select signals SL1 to SLJ based on the decoded signal DEC. Each of the select circuits S1 to SJ includes switches SW11 to SW15, . . . , SWJ1 to SWJ5 respectively connected to the global word lines GWL1 to GWLJ. Each of the select circuits S1 to SJ receives the read voltages $V_{RD}1$ and $V_{RD}2$, the program voltages $V_{PG}$ and $V_{PS}$, and the erase voltage $V_{ERS}$, and outputs word line bias voltages $V_{WF}1$ to $V_{WF}J$, $V_{WS}1$ to $V_{WS}J$ or $V_{WT}1$ to $V_{WT}J$ to the global word lines GWL1 to GWLJ in response to the select signal SL1 to SLJ. This will be described in more detail. For example, the switches SW11 to SW15 of the select circuit S1 are connected between the read voltages $V_{RD}1$ and $V_{RD}2$, the program voltages $V_{PG}$ and $V_{PS}$, and the erase voltage $V_{ERS}$, and the global word line GWL1, respectively. The switches SW11 to SW15 are turned on or off according to logic values of the bits B1 to B5 of the select signal SL1. In this case, in the event that the switches SW11 to SW15 are implemented using NMOS transistors, when logic values of the bits B1 to B5 are 1, the switches SW11 to SW15 are turned on. Meanwhile, when the logic values of the bits B1 to B5 are 0, the switches SW11 to SW15 are turned off.

For example, when one of the switches SW11 and SW12 is on, one of the read voltages $V_{RD}1$ and $V_{RD}2$ is input to the global word line GWL1 as the word line bias voltage $V_{WF}1$. Furthermore, when one of the switches SW13 and SW14 is on, one of the program voltages $V_{PG}$ and $V_{PS}$ is input to the global word line GWL1 as the word line bias voltage $V_{WS}1$. Moreover, when the switch SW15 is on, the erase voltage $V_{ERS}$ is input to the global word line GWL1 as the word line bias voltage $V_{WT}1$. In this case, because the select signal generator 65 generates a logic value of one of the bits B1 to B5 as 1 and logic values of the remaining bits as 0, one of the switches SW11 to SW15 is turned on, and the remaining switches are turned off. As a result, one of the read voltages $V_{RD}1$ and $V_{RD}2$, the program voltages $V_{PG}$ and $V_{PS}$, and the erase voltage $V_{ERS}$ is applied to the global word line GWL1. The construction and operation of the select circuits S2 to SJ are similar to those of the aforementioned select circuit S1.

It has been shown in FIG. 6 that each of the select circuits S1 to SJ has five switches. It is, however, to be noted that the construction of the select circuits S1 to SJ can be changed or modified. As will be understood by those skilled in the art, there are numerous ways of having the select circuits S1 to SJ output the word line bias voltages $V_{WF}1$ to $V_{WF}J$, $V_{WS}1$ to $V_{WS}J$ or $V_{WT}1$ to $V_{WT}J$.

Furthermore, for simplification of the drawing, only the NMOS transistors G11, GK1, G1J and GKJ connected to the global word lines GWL1 and GWLJ, the local word lines WL11, WL1J, WLK1 and WLKJ, and the memory cells M111, M11T, M1J1, M1JT, MK11, MK1T, MKJ1 and MKJT are shown in FIG. 6. The gates of the memory cells M111 to M11T are connected to the local word line WL11, and the gates of the memory cells M1J1 to M1JT are connected to the local word line WL1J. In addition, the gates of the memory cells MK11 to MK1T are connected to the local word line WLK1, and the gates of the memory cells MKJ1 to MKJT are connected to the local word line WLKJ. Source and drain of the NMOS transistor G11 are connected to the global word line GWL1 and the local word line WL11, respectively. Source and drain of the NMOS transistor GK1 are connected to the global word line GWL1 and the local word line WLK1, respectively. In addition, source and drain of the NMOS transistor G1J are connected to the global word line GWLJ and the local word line WL1J, respectively. Source and drain of the NMOS transistor GKJ are connected to the global word line GWLJ and the local word line WLKJ, respectively.

Figure 7:
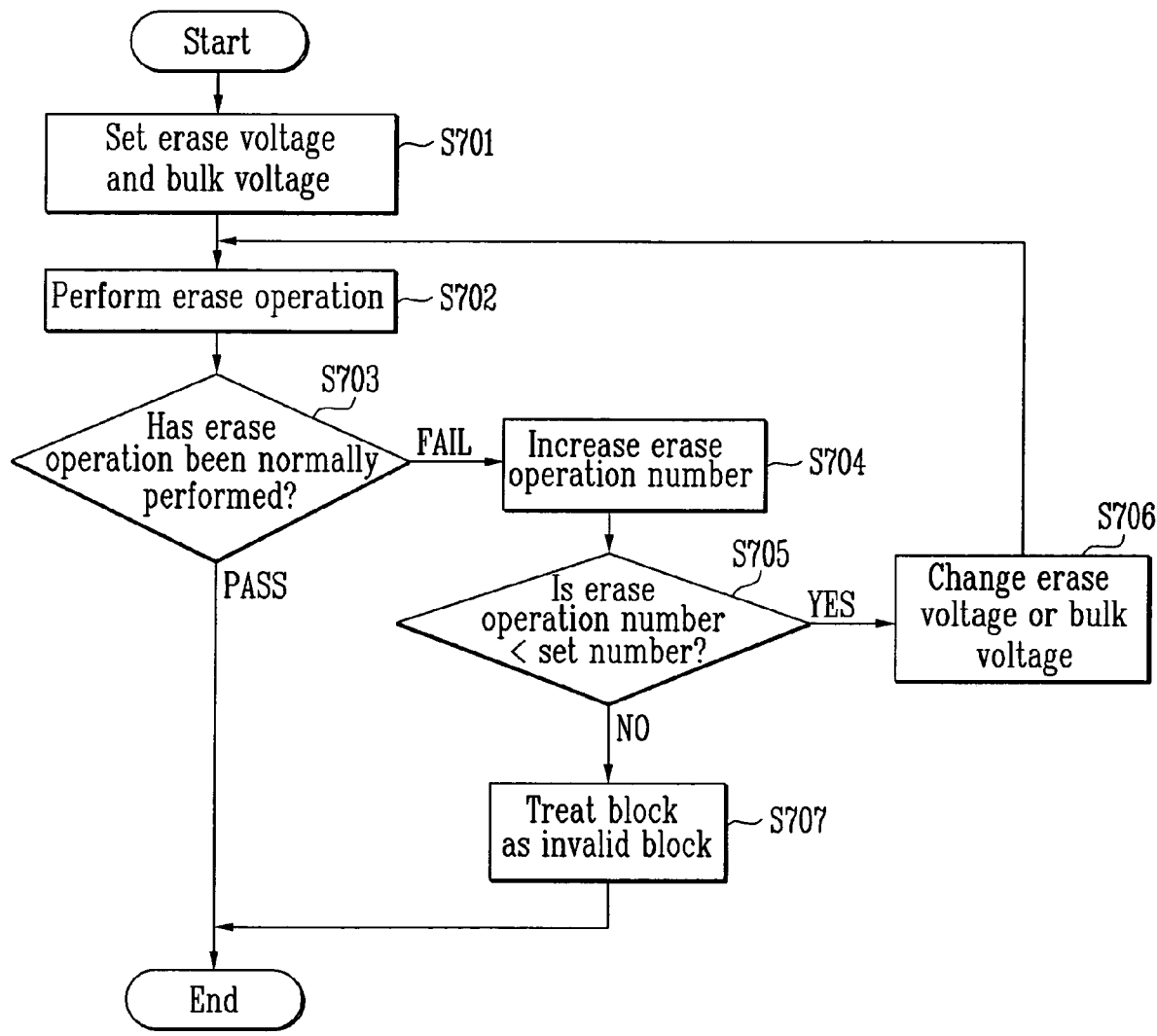
FIG. 7 is a flowchart illustrating a method of controlling an erase operation of the flash memory device according to an embodiment of the present invention.

FIG. 7 is a flowchart illustrating a method of controlling the erase operation of the flash memory device according to an embodiment of the present invention. The erase voltage $V_{WT}J$ and the level of the bulk voltage $V_{CB}$ are set so that the erase voltage $V_{WT}J$ has a positive voltage level and a difference between the erase voltage $V_{WT}J$ and the bulk voltage $V_{CB}$ is 15 V (S701). Once the erase voltage $V_{WT}J$ and the bulk voltage $V_{CB}$ have been set, an erase operation is performed on the memory cells of a selected block using the erase voltage $V_{WT}J$ and the bulk voltage $V_{CB}$ according to a block selection signal BLKWL (S702). After performing the erase operation, it is determined whether the erase operation has been performed properly (S703). The erase operation is determined to have been performed properly if all of the memory cells in the selected block have been erased, in which case the erase operation ends. On the other hand, if there are one or more memory cells that have not been erased, the erase operation is determined to have been performed improperly and is performed again by resetting the erase voltage $V_{WT}J$ and the bulk voltage $V_{CB}$. This will be described in more detail below.

The number of the erase operation performed is incremented by 1 (S704). It is then determined whether the number of the erase operation performed is smaller than a predetermined number (S705). If the number of the erase operation performed is smaller than the predetermined number, the erase voltage $V_{WT}J$ and the bulk voltage $V_{CB}$ are changed (S706). At this time, the erase voltage $V_{WT}J$ and the bulk voltage $V_{CB}$ are changed such that a difference between the erase voltage $V_{WT}J$ and the bulk voltage $V_{CB}$ becomes gradually greater than 15 V. A detailed method of changing the erase voltage $V_{WT}J$ and the bulk voltage $V_{CB}$ will be described later.

If the erase voltage $V_{WT}J$ and the bulk voltage $V_{CB}$ have been changed, an erase operation (or re-erase operation) is performed using the changed voltages (S702). The above-mentioned steps (S703 to S705) are performed again. The selected memory block is flagged as an invalid block if the erase operation is not completed within a given cycle (S707). In the present embodiment, the selected memory block is flagged when the number of the erase operation equals to the predetermined number.

The erase operation of the flash memory device 100, which has been described with reference to FIG. 7, will now be described in more detail with reference to FIGS. 4 to 6. The control logic circuit 130 generates the erase command ERS in response to the external control signals /WE, /RE, ALE and CLE and the command signal CMD, and generates the row address signal RADD based on the address signal ADD. The bulk voltage generator 40 of the high voltage generator 140 generates the bulk voltage $V_{CB}$ of a high voltage (for example, 17 V) level in response to the erase command ERS, and supplies the generated bulk voltage $V_{CB}$ to the bulk material (P well) in which the memory cell blocks MB1 to MBK are formed.

Furthermore, the first bias voltage generator 50 of the high voltage generator 140 generates the drain bias voltage $V_{GD}$ and the source bias voltage $V_{GS}$ of a low voltage (for example, 0V) in response to the erase command ERS. Accordingly, the drain bias voltage $V_{GD}$ is applied to the global drain select line GDSL, and the source bias voltage $V_{GS}$ is applied to the global source select line GSSL. Meanwhile, the X-decoder 150 decodes the row address signal RADD, and outputs the decoded signal DEC. The second bias voltage generator 60 of the high voltage generator 140 generates the word line bias voltages $V_{WT}1$ to $V_{WT}J$ in response to the erase command ERS and the decoded signal DEC, and supplies the generated voltages to the global word lines $G_{WL}1$ to $G_{WL}J$, respectively. More particularly, the third pump circuit 63 of the second bias voltage generator 60 generates the erase voltage $V_{ERS}$ having a positive value in response to the erase command ERS. For example, the erase voltage $V_{ERS}$ is lower than the bulk voltage $V_{CB}$ that is supplied to the P-well of the memory cell in the erase operation, and has a positive value. Preferably, a difference between the bulk voltage $V_{CB}$ and the erase voltage $V_{ERS}$, which are supplied to a P-well of a memory cell in the erase operation, can be set to be higher than or the same as 5V. The bias voltage selection unit 64 of the second bias voltage generator 60 selects the erase voltage $V_{ERS}$ in response to the decoded signal DEC, and outputs the selected voltage as the word line bias voltages $V_{WT}1$ to $V_{WT}J$. In more detail, the select signal generator 65 of the bias voltage selection unit 64 outputs the values of the bits B1 to B5 of the select signals SL1 to SLJ as all "00001" in response to the decoded signal DEC. The switches SW15 to SWJ5 of the select circuits S1 to SJ of the bias voltage selection unit 64 are turned on, and the switches SW11 to SWJ1, SW12 to SWJ2, SW13 to SWJ3 and SW14 to SWJ4 are all turned off, in response to the select signals SL1 to SLJ. Accordingly, the erase voltage $V_{ERS}$ is input to the global word lines GWL1 to GWLJ as the word line bias voltages $V_{WT}1$ to $V_{WT}J$ through the switches SW15 to SWJ5.

Furthermore, the block selection unit 160 selects one of the memory cell blocks MB1 to MBK in response to the decoded signal DEC, and connects local word lines of a selected memory cell block to the global word lines GWL1 to GWLJ, respectively. For example, if the memory cell block MB1 is selected, the block switch unit 161 of the block selection unit 160 enables the block select signal BSEL1 in response to the decoded signal DEC, and disables all the block select signals BSEL2 to BSELK. As a result, only the switching unit PG1 of the block selection unit 160 is enabled, and the switching units PG2 to PGK are all disabled. In more detail, the switching elements GD1, G11 to G1J and GS1 of the switching unit PG1 are turned on at the same time, and the switching elements GD2 to GDK, G21 to G2J, . . . , GK1 to GKJ, GS2 to GSK of the switching units PG2 to PGK are all turned off. Accordingly, the drain select line DSL1 of the memory cell block MB1 is connected to the global drain select line GDSL, and the source select line SSL1 is connected to the global source select line GSSL. Consequently, as the drain bias voltage $V_{GD}$ and the source bias voltage $V_{GS}$ of a low voltage level are applied to the drain select line DSL1 and the source select line SSL1, respectively, the drain select transistor DST1 and the source select transistor SST1 are turned off. Accordingly, drains and sources of the memory cells M111 to M1JT of the memory cell block MB1 are floated.

In addition, the local word lines WL11 to WL1J of the memory cell block MB1 are connected to the global word lines GWL1 to GWLJ, respectively. As a result, the word line bias voltages $V_{WT}1$ to $V_{WT}J$ of the global word lines GWL1 to GWLJ are transferred to the local word lines WL11 to WLLJ, respectively. Therefore, a voltage difference (for example, 15 V or more) is generated between gates and bulks of the memory cells M111 to M1JT of the memory cell block MB1, and electrons are discharged from the floating gates of the memory cells M111 to M1JT by means of the voltage difference, whereby the erase operation of the memory cells M111 to M1JT is performed.

Figure 8A:
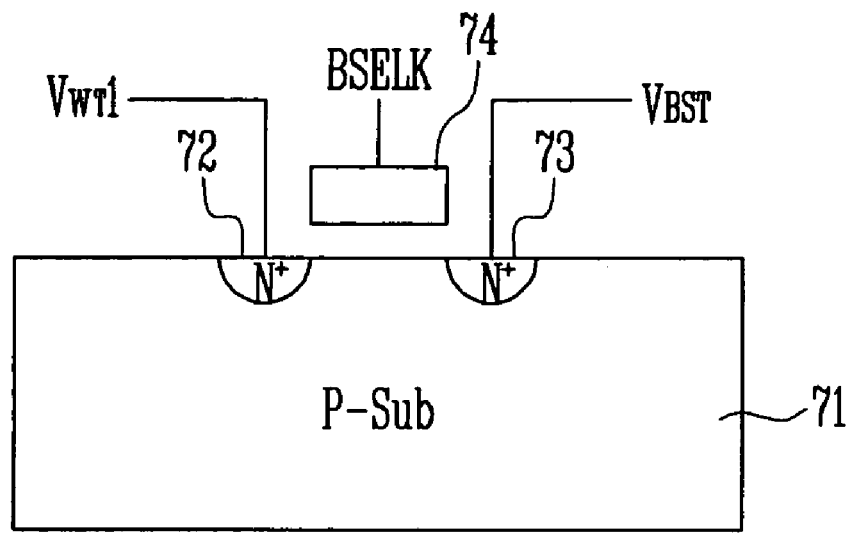
FIG. 8A is a cross-sectional view showing an example of a switching element shown in FIG. 6.
Figure 8B:
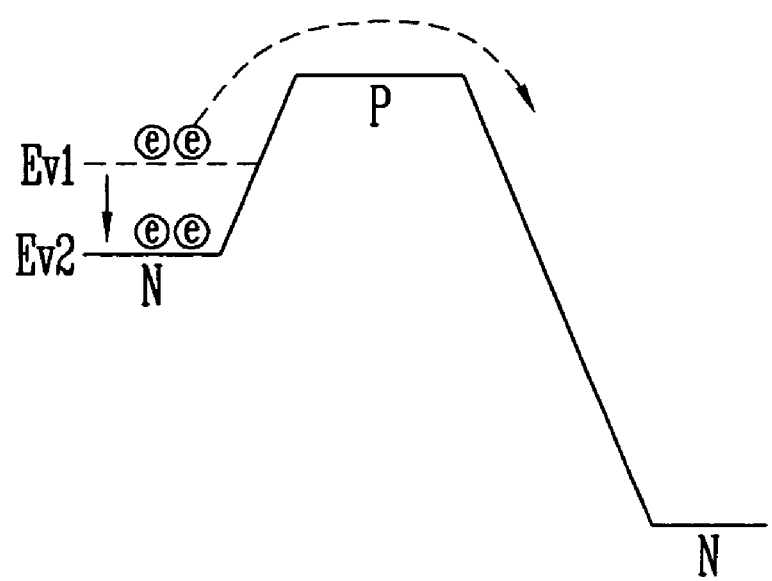
FIG. 8B is a view illustrating variation in the energy potential depending on variation in the bias voltage of the word line in the switching element shown in FIG. 6.

Meanwhile, the drain select lines DSL2 to DSLJ of the memory cell blocks MB2 to MBK are separated from the global drain select line GDSL, and the source select lines SSL2 to SSLJ are also separated from the global source select line GSSL. Furthermore, the local word lines WL21 to WL2J, . . . , WLK1 to WLKJ of the memory cell blocks MB2 to MBK are all separated from the global word lines GWL1 to GWLJ. Accordingly, the local word lines WL21 to WL2J, . . . , WLK1 to WLKJ are boosted by means of the bulk voltage $V_{CB}$ of a high voltage (for example, 20V) level, which is applied to the memory cells of the memory cell blocks MB2 to MBK. Consequently, the boosting voltage $V_{BST}$ close to the bulk voltage $V_{CB}$ is generated in the local word lines WL21 to WL2J, . . . , WLK1 to WLKJ. In this case, the operation of the NMOS transistors G21 to G2J, . . . , GK1 to GKJ, which are connected between the local word lines WL21 to WL2J, . . . , WLK1 to WLKJ of the memory cell blocks MB2 to MBK and the global word lines GWL1 to GWLJ, will be described in more detail with reference to FIGS. 8A and 8B. FIGS. 8A and 8B show a cross-sectional view of the NMOS transistor GK1, and the energy potential thereof, respectively. The operation of the NMOS transistors G21 to G2J, . . . , GK2-GKJ is similar to that of the NMOS transistor GK1. Detailed description thereof will be thus omitted for simplicity.

FIG. 8A is a cross-sectional view of the NMOS transistor GK1, a switching element, which is connected to the local word line WLK1 of the memory cell block MBK. A source 72 of the NMOS transistor GK1 is applied with the word line bias voltage $V_{WT}1$ having a positive value, and a gate 74 thereof is applied with the block select signal BSELK having a low voltage (for example, 0V) level. A drain 73 of the NMOS transistor GK1 is applied with the boosting voltage $V_{BST}$. When the block select signal BSELK is at a low level, the NMOS transistor GK1 is turned off. In addition, because the word line bias voltage $V_{WT}1$ has the positive value, the energy potential of the source 72 region decreases to approximately Ev2, as shown in FIG. 8B. Accordingly, the amount of electrons, which is introduced from the source 72 to a substrate 71, is reduced, and the amount of electrons, which is introduced into the local word line WLK1 connected to the drain 73, is reduced. As a result, as the leakage current generated in the NMOS transistor GK is reduced, the local word line WLK1 is kept to the boosting voltage $V_{BST}$ level. Therefore, data of memory cells connected to the local word line WLK1 are not erased.

On the other hand, in the case where the word line bias voltage $V_{WT}1$ of 0V is applied to the source 72, the energy potential of the source 72 region increases to approximately Ev1, as shown in FIG. 8B. Accordingly, the amount of electrons that are introduced from the source 72 to the substrate 71 increases, the amount of the leakage current of the NMOS transistor GK1 increases. In this connection, to reduce the leakage current of the NMOS transistor GK1, the energy potential of the source 72 region needs to be reduced.

After the erase operation is performed under the above-mentioned condition, it is determined whether all memory cells of a block on which the erase operation has been performed have been erased properly. This can be confirmed using data output through the Y-decoder 180 via the page buffer 170.

For example, the erase operation may be determined to have been performed properly if the data output by the Y-decoder 180 are "1," where a read operation is performed on a string basis in a state where 0 V is applied to all word lines. The erase operation may be determined to have been performed improperly if the data output by the Y-decoder 180 are "0".

In the prior art, the cells are flagged as "invalid cells" after the first determination of the erase operation failure. These cells are not used thereafter, which results in reducing data storage capacity. In the present embodiment, however, an erase operation is performed again by increasing the voltage difference between the word lines and the bulk, so that the cells that failed the first erase operation may properly perform a subsequent erase operation. This minimizes prematurely flagging a memory block as an invalid block. A process of performing the erase operation again by controlling the voltage difference as described above will now be described in more detail.

Figure 9A:
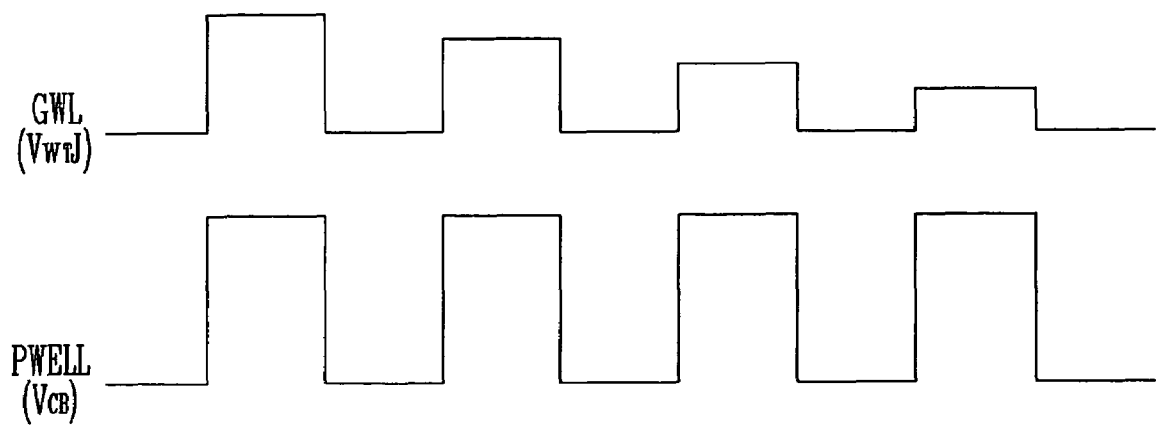
FIGS. 9A to 9C are waveforms illustrating a first embodiment in which a voltage is applied to global word lines and a P well at the time of an erase operation in FIG. 5.
Figure 9B:
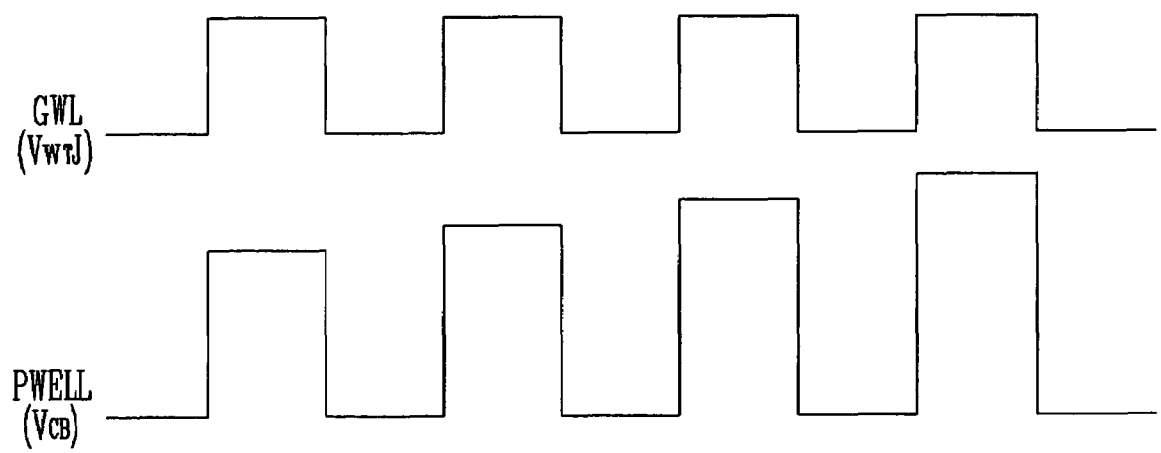
Figure 9C:
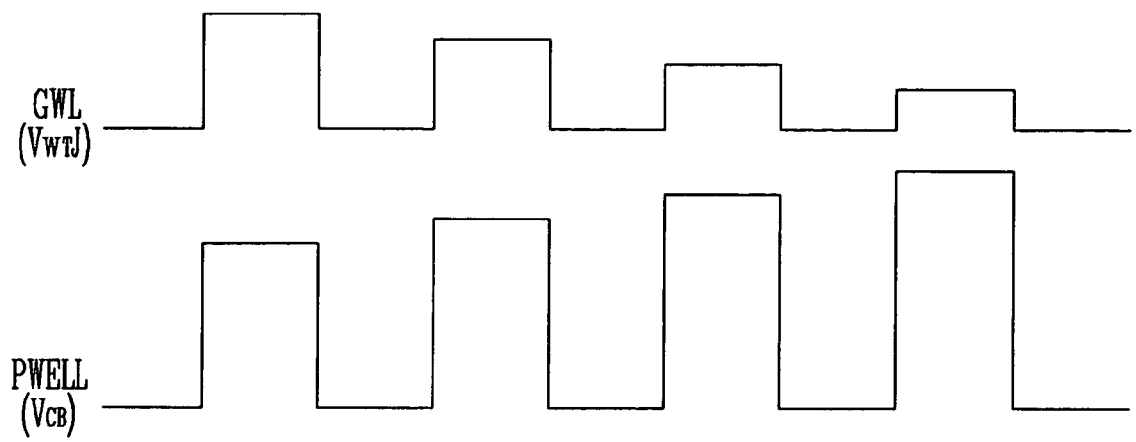
Figure 10A:
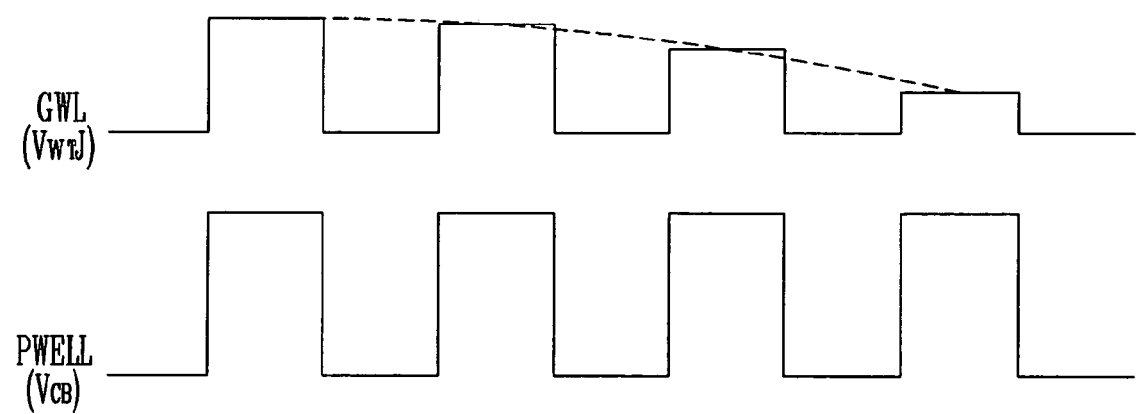
FIGS. 10A to 10C are waveforms illustrating a second embodiment in which a voltage is applied to global word lines and a P well at the time of an erase operation in FIG. 5.
Figure 10B:
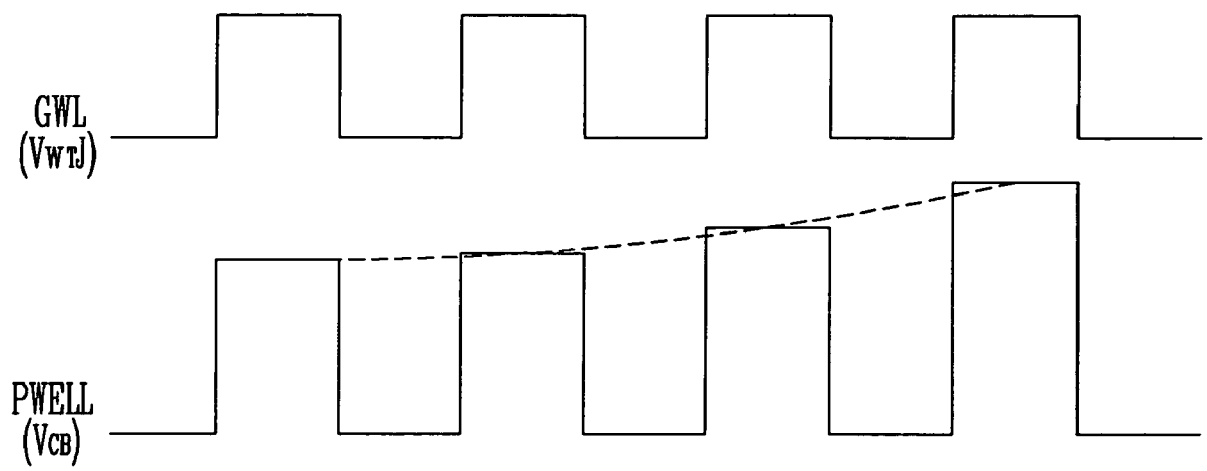
Figure 10C:
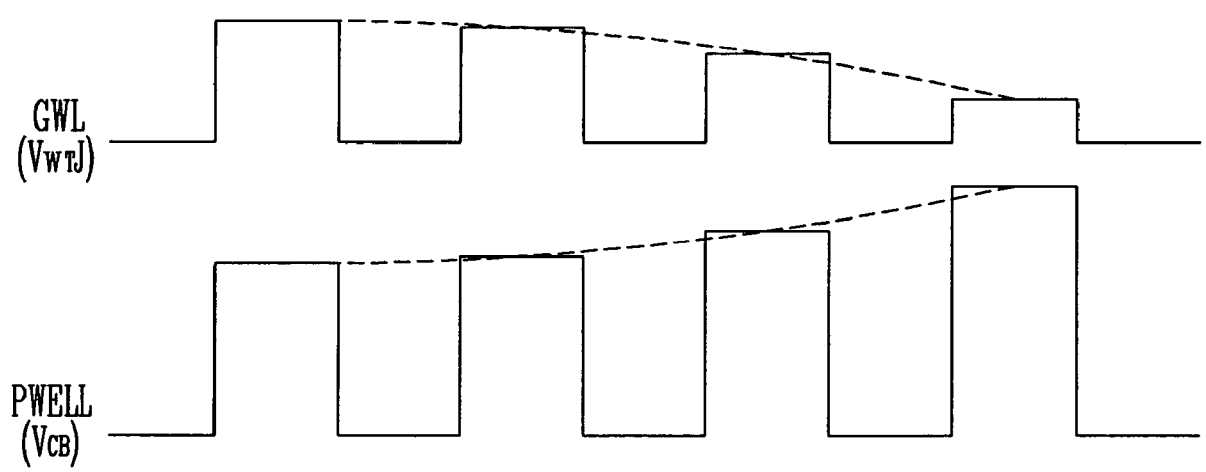

FIGS. 9A to 9C are waveforms associated with the circuit diagram of FIG. 5 where a voltage is applied to global word lines and a P well at the time of an erase operation according to one embodiment. FIGS. 10A to 10C are waveforms associated with the circuit diagram of FIG. 5 where a voltage is applied to global word lines and a P well at the time of an erase operation according to another embodiment.

Referring to FIG. 9A, an erase operation is performed by applying the erase voltage $V_{WT}J$ having a positive value to the global word line GWL and a bulk voltage $V_{CB}$ to the bulk PWELL. The bulk voltage $V_{CB}$ is substantially greater than the erase voltage $V_{WT}J$, e.g., 15 V or more. After performing a first erase attempt, an erase verification process is conducted to determine whether or not the erase operation has been performed properly. The erase operation is determined to have been performed properly if all of the memory cells in the selected memory block have been erased. If one or more of the memory cells in the selected memory block have not been erased, the erase operation is determined to not have been performed properly. The erase verification process involves checking the data output by the Y-decoder 180. The data output by the Y-decoder 180 are input to the second bias voltage generator 60 that generates the erase voltage $V_{WT}J$ and the bulk voltage generator 40.

A second erase attempt is carried out if the erase operation is determined not to have been performed properly. The second erase attempt involves having the second bias voltage generator 60 lower the level of the erase voltage $V_{WT}J$ by a given amount (e.g., by 0.1 to 0.5 V) and applying a lowered erase voltage $V_{WT}J$ to the global word line GWL. Accordingly, the voltage difference between the global word line GWL and the bulk PWELL is increased.

Another erase verification process is performed to determine whether all of the memory cells in the selected memory block have been erased, i.e., whether the second erase attempt has been performed properly. If it is determined that the second erase attempt has not been performed properly, a third erase attempt is carried out by having the second bias voltage generator 60 lower the erase voltage $V_{WT}J$ by a given amount (e.g., 0.1 to 0.5 V) to increase the voltage difference even more and apply a lowered erase voltage to the global word line GWL. This erase method is called an "Incremental Stepping Pulse Erase (ISPE) method". The voltage difference is increased according to the ISPE method and the erase operation is performed again.

The erase attempts are repeated until all of the selected memory cells are erased properly or if the number of the erase attempts made equals to a predetermined number. If all of the selected memory cells are not properly erased after the predetermined number of attempts, the memory block is flagged as an invalid block. The predetermined number may be set according to application It has been described above that when the erase operation is performed, the erase voltage $V_{WT}J$ applied to the global word line GWL is lowered in order to increase the voltage difference between the word lines and the bulk. However, the bulk voltage generator 40 may raise the bulk voltage $V_{CB}$ by 0.5 to 1 V in order to increase the voltage difference between the word lines and the bulk, as shown in FIG. 8B. Alternatively, the bulk voltage generator 40 may raise the bulk voltage $V_{CB}$ while the second bias voltage generator 60 lowers the erase voltage $V_{WT}J$ in order to increase the voltage difference between the word lines and the bulk, as shown in FIG. 8c.

It has been described above that the erase voltage $V_{WT}J$ is lowered as a linear function or the bulk voltage $V_{CB}$ is raised as a linear function. However, the erase voltage $V_{WT}J$ may be lowered as an exponential function or the bulk voltage $V_{CB}$ may be raised as an exponential function as shown in FIGS. 10A to 10C. Alternatively, the erase voltage $V_{WT}J$ may be lowered as a quadratic function or the bulk voltage $V_{CB}$ may be raised as a quadratic function.

In accordance with the above method, the present invention can minimize invalid blocks from occurring and can also prevent a threshold voltage from decreasing due to a shallow erase phenomenon in non-selected blocks on which an erase operation has not been performed, or the fast program or the slow erase phenomenon from occurring as the erase operation is repeatedly performed.

Figure 11:
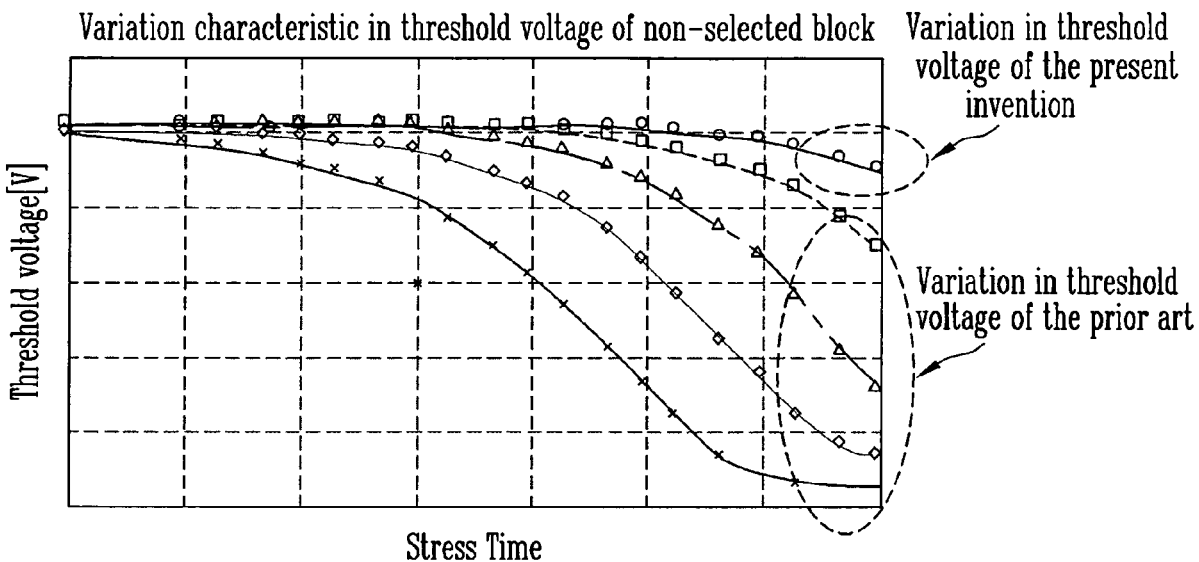
FIG. 11 is a characteristic graph for comparing variations in threshold voltages of non-selected blocks at the time of an erase operation.

FIG. 11 is a characteristic graph for comparing variations in threshold voltages of non-selected blocks at the time of an erase operation. In the prior art, a leakage current was generated in a switching element (for example, G1J in FIG. 5, where J is an integer). Accordingly, the shallow erase phenomenon in which an erase operation is performed in a state where a voltage applied to word lines is gradually lowered was generated. For this reason, a problem was generated in that the threshold voltage of a memory cell in the non-selected block is lowered.

In the present invention, however, an erase operation is performed in a state where global word lines are applied with a positive erase voltage in order to prevent a leakage current from occurring in a switching element (for example, G1J in FIG. 5, where J is an integer). Accordingly, the shallow erase phenomenon is rarely generated in non-selected blocks. Consequently, an amount of change in the threshold voltage can be minimized.

Figure 1:
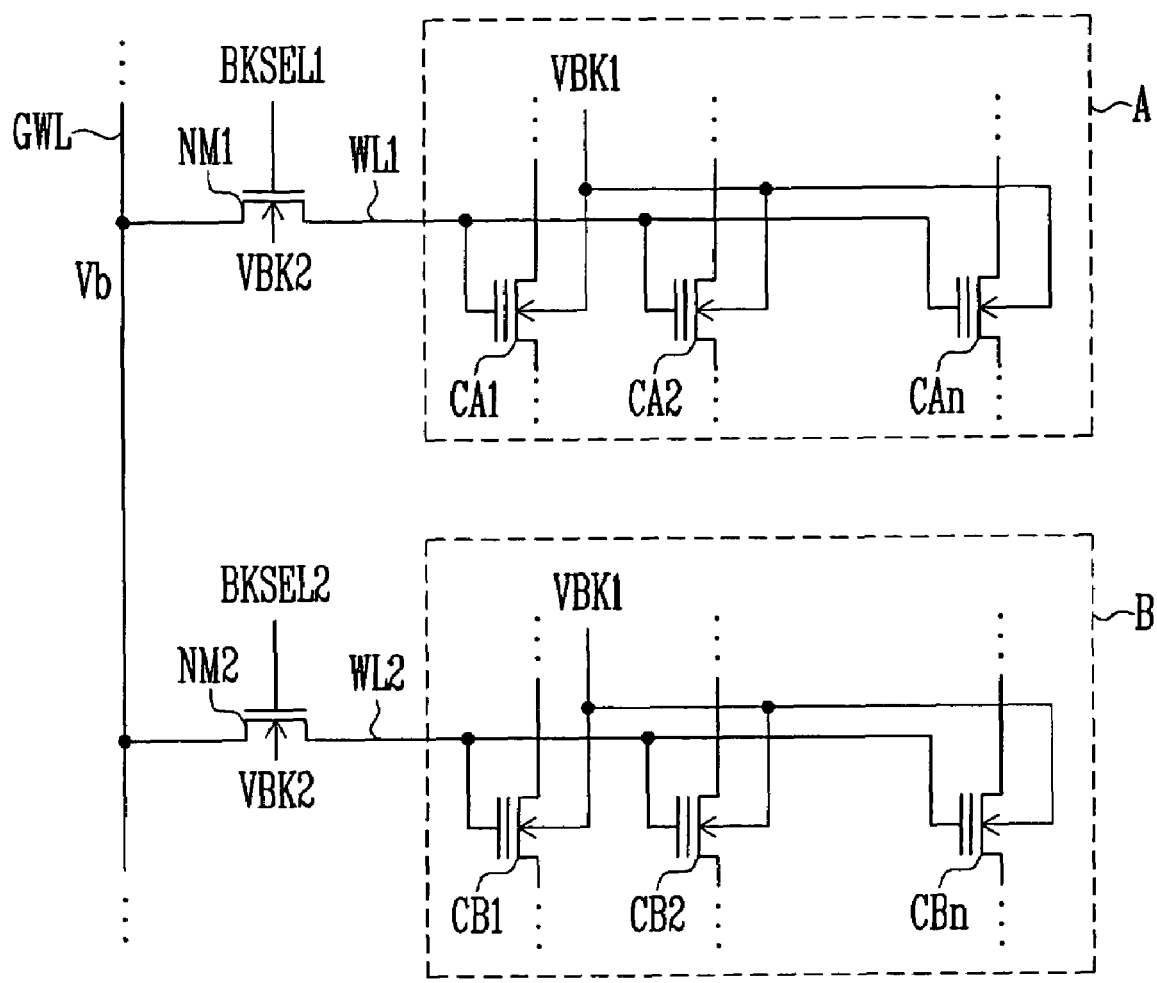
FIG. 1 is a circuit diagram of memory cells and pass gates illustrating the erase operation of a conventional flash memory device.
Figure 2:
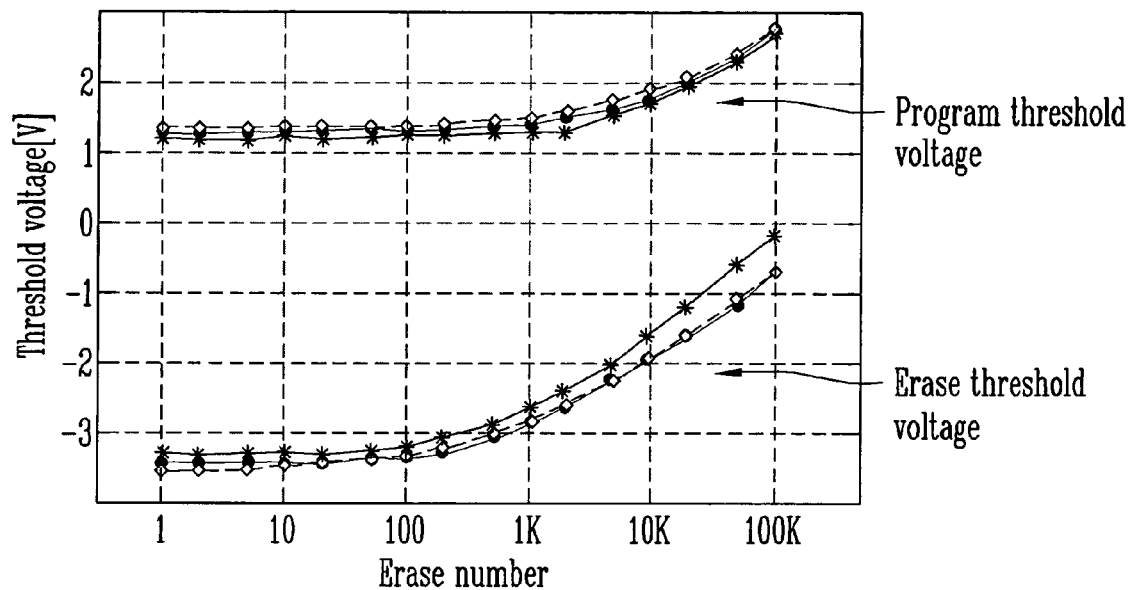
FIG. 2 is a characteristic graph showing a slow erase characteristic and a fast program characteristic depending on the number of an erase operation in the prior art.
Figure 3:
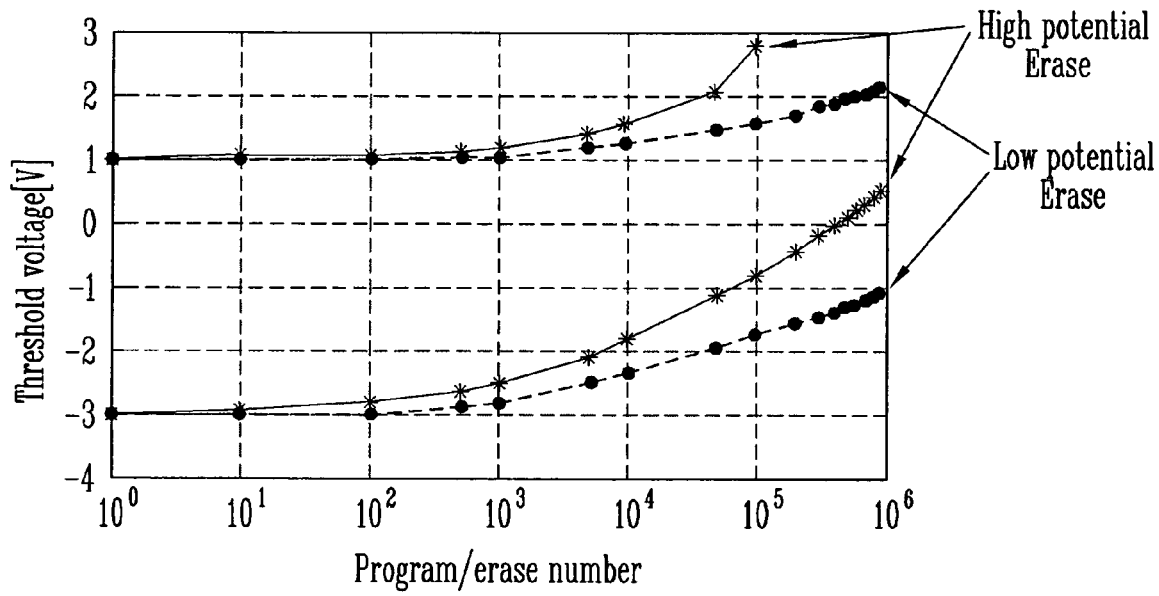
FIG. 3 is a characteristic graph showing a slow erase characteristic and a fast program characteristic depending on the level of an erase voltage in the prior art.
Figure 12:
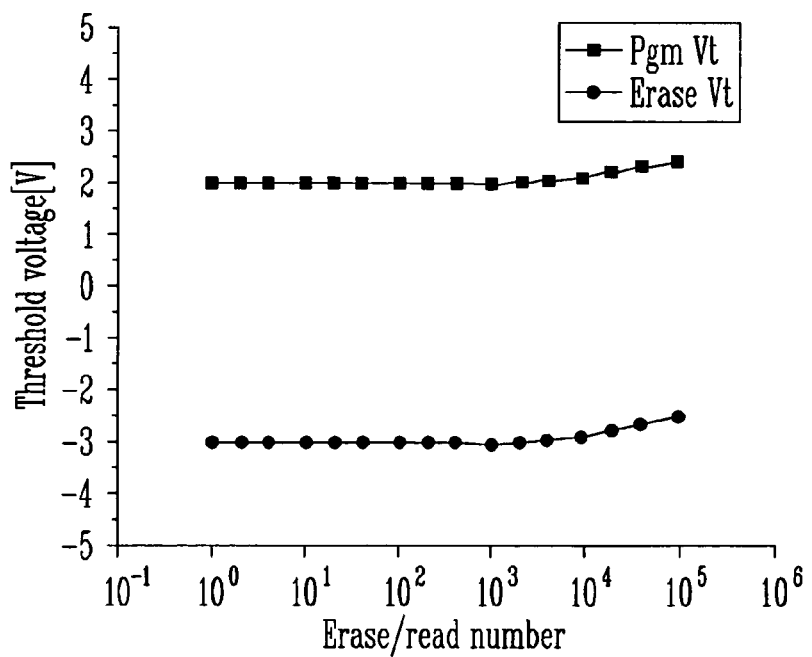
FIG. 12 is a characteristic graph illustrating a slow erase characteristic and a fast program characteristic depending on the number of an erase operation according to an embodiment of the present invention.

FIG. 12 is a characteristic graph illustrating a slow erase characteristic and a fast program characteristic depending on the number of an erase operation according to an embodiment of the present invention. In a first erase operation, a voltage difference between the word lines and the bulk is maintained to the extent that the erase operation is performed properly. If the erase operation is performed properly, the erase operation is performed again by increasing the voltage difference. Accordingly, although the erase operation is performed repeatedly, the fast program phenomenon and the slow erase phenomenon are generated within approximately 0.5 V. From FIG. 12, it can be seen that the fast program phenomenon or the slow erase phenomenon is rarely generated in the present invention considering that the fast program phenomenon and the slow erase phenomenon shown in FIG. 2 in the prior art are generated over at least 2 V.

As described above, the present invention includes one or more of the following advantages. First, at the time of the erase operation, a voltage higher than 0 V is applied to the global word lines. It is therefore possible to prevent the leakage current from occurring in the switching elements connected between the global word lines and the local word lines. Therefore, a voltage applied to word lines of a non-selected block on which the erase operation has not been performed can be prevented from decreasing, and the shallow erase phenomenon can be prevented from occurring in a non-selected block.

Second, in the prior art, in the process of verifying whether the erase operation has been performed properly after the erase operation is performed, if there are memory cells on which the erase operation has not been performed properly, corresponding blocks are treated as invalid blocks and are thus not used. This results in a reduced data storage capacity. In the present invention, however, if there exist memory cells on which the erase operation has not been performed properly, the erase operation is performed again by increasing the voltage difference between the word lines and the bulk. It is therefore possible to minimize the occurrence of invalid blocks and thus to minimize a reduction in the data storage capability.

Third, if the erase operation is performed in a state where the voltage difference between the word lines and the bulk is high from the first time, an electrical characteristic of a memory cell may be degraded since electrons are trapped at the tunnel oxide layer or stress is given to the tunnel oxide layer. In the present invention, however, the erase operation is performed using only a minimum voltage difference for the erase operation. If the erase operation is failed, the erase operation is performed again by increasing the voltage difference. Accordingly, an amount of electrons trapped at the tunnel oxide layer or stress given to the tunnel oxide layer can be minimized, resulting in an extended lifespan of the memory cell.

Fourth, in the present invention, at the time of an initial erase operation, the erase operation is performed using a minimum voltage difference. If fail occurs, the erase operation is performed again by increasing the voltage difference. Therefore, although the read/erase operations are repeatedly performed, the fast program or the slow erase phenomenon can be prevented from occurring to the greatest extent.

In accordance with the above-described operation, the reliability of the erase operation can be improved, the occurrence of failure can be minimized, and the lifespan of devices can be increased.

Although the foregoing description has been made with reference to the various embodiments, it is to be understood that changes and modifications of the present invention may be made by the ordinary skilled in the art without departing from the spirit and scope of the present invention and appended claims.

What is claimed is:

1. A non-volatile memory device, comprising:
   first and second memory cell blocks, each including a plurality of memory cells and including a local drain select line, a local source select line, and local word lines;
   a block selection unit to connect a given local word lines to global word lines, respectively, in response to a block selection signal;
   a first bias voltage generator configured to apply at least first and second erase voltages to the global word lines during an erase operation, the first erase voltage being applied to the global word lines during a first erase attempt of the erase operation, the second erase voltage being applied to the global word lines during a second erase attempt, where the second erase attempt is performed if the first erase attempt did not successfully perform the erase operation, the first and second erase voltages being positive voltages; and
   a bulk voltage generator to apply a bulk voltage to a bulk of the memory cells during the erase operation.

2. The memory device of claim 1, wherein an erase voltage applied to the global word lines is reduced by a given voltage each time a new erase attempt is made, wherein a given erase operation is stopped after a predetermined number of unsuccessful erase attempts.

3. The memory device of claim 1, wherein the first bias voltage generator generates the erase voltage so that a voltage difference between the local word lines and the bulk becomes 15 V at the time of the first erase attempt, the bulk being a well wherein the first memory cell block is formed.

4. The memory device of claim 3, wherein an erase voltage applied to the global word lines is reduced by a given voltage each time a new erase attempt is made, wherein the given voltage is no more than 0.5 V.

5. The memory device of claim 1, further comprising:
   a page buffer to read data stored in the memory cells; and
   a Y-decoder to output data stored in the page buffer to a data I/O buffer and the first bias voltage generator.

6. The memory device of claim 5, wherein the first bias voltage generator decreases the first erase voltage to the second erase voltage based on the data output from the Y-decoder,
   wherein the memory device is a NAND flash memory device.

7. A flash memory device, comprising:
   memory cell blocks each respectively including a local drain select line, a local source select line, and local word lines to which a plurality of memory cells are connected;
   a block selection unit to connect the local word lines to global word lines, respectively, in response to a block selection signal;
   a first bias voltage generator to apply a positive erase voltage to the global word lines at the time of an erase operation; and
   a bulk voltage generator configured to apply a first bulk voltage to a bulk of the memory cells during a first erase attempt of the erase operation, and apply a second bulk voltage to the bulk during a second erase attempt if the first erase attempt has not been performed properly.

8. The memory device of claim 7, wherein the first erase attempt is considered to have not been performed properly if not all of the memory cells selected for the erase operation have been erased by the first erase attempt.

9. The flash memory device of claim 7, wherein the bulk voltage generator generates the first bulk voltage so that a voltage difference between the local word lines and the bulk is at least 15 V at the time of an initial erase operation.

10. The flash memory device of claim 9, wherein the bulk voltage generator increases the first bulk voltage by no more than 1 V to generate the second bulk voltage.

11. The flash memory device of claim 7, further comprising:
    a page buffer to read data stored in the memory cells; and
    a Y-decoder to output data stored in the page buffer to a data I/O buffer and the bulk voltage generator.

12. The flash memory device of claim 11, wherein the bulk voltage generator generates the second bulk voltage in order to perform the second erase attempt of the erase operation based on the data output from the Y-decoder.

13. A flash memory device, comprising:
    memory cell blocks each respectively including a local drain select line, a local source select line, and local word lines to which a plurality of memory cells are connected;
    a block selection unit to connect the local word lines to global word lines, respectively, in response to a block selection signal;
    a first bias voltage generator to apply a positive erase voltage to the global word lines at the time of an erase operation, and if there exists a memory cell that has not been erased, decreasing the erase voltage and applying a lowered erase voltage to the global word lines in order to perform the erase operation again; and
    a bulk voltage generator to apply a bulk voltage to a bulk of the memory cells at the time of the erase operation, and if there exists a memory cell that has not been erased, increasing the bulk voltage and apply an increased bulk voltage to the bulk for the purpose of the re-execution of the erase operation again.

14. The flash memory device of claim 13, wherein:
    at the time of an initial erase operation, the first bias voltage generator and the bulk voltage generator generate the erase voltage and the bulk voltage, respectively, so that a voltage difference between the local word lines and the bulk becomes 15 V; and
    when the erase operation is performed again, the bulk voltage generator increases the bulk voltage and the first bias voltage generator decreases the erase voltage so that the voltage difference between the local word lines and the bulk becomes higher than 15 V.

15. The flash memory device of claim 13, wherein:
the first bias voltage generator decreases the erase voltage on a 0.1 to 0.5 V basis as a linear function, as a quadratic function or as an exponential function; and
the bulk voltage generator increases the bulk voltage on a 0.5 to 1 V basis as a linear function, as a quadratic function or as an exponential function.

16. The flash memory device of claim 13, further comprising:
a page buffer to read data stored in the memory cells; and
a Y-decoder to output data stored in the page buffer to a data I/O buffer, the bulk voltage generator, and the first bias voltage generator.

17. The flash memory device of claim 16, wherein if data that have not been erased, of the data output from the Y-decoder, are detected, the first bias voltage generator decreases the erase voltage and the bulk voltage generator increases the bulk voltage in order to perform the erase operation again.

18. The flash memory device of claim 13, further comprising an X-decoder to decode a row address signal and output the block selection signal to the high voltage generating unit.

19. The flash memory device of claim 11, further comprising a second bias voltage generator to apply a predetermined operating voltage to the local drain select line and the local source select line according to any one of program, read, and erase operations.

20. The flash memory device of claim 17, wherein the first bias voltage generator comprises:
a first pump circuit to generate read voltages necessary for a read operation in response to a read command;
a second pump circuit to generate program voltages necessary for a program operation in response to a program command;
a third pump circuit to generate the erase voltage in response to an erase command, and to decrease the erase voltage and output a decreased erase voltage if data are determined not to have been erased based the data output from the Y-decoder, are detected; and
a bias voltage selection unit to select the read voltages, the program voltages or the erase voltage in response to an operation command signal, and output a selected voltage to the global word lines, respectively.

21. The flash memory device of claim 20, wherein the bias voltage selection unit comprises:
a select signal generator to generate select signals based on the operation command signal; and
select circuits respectively connected to the global word lines, the select circuits being configured to output the read voltages, the program voltages, the erase voltage, or a combination thereof to the global word lines, respectively, in response to the select signals.

22. A method of erasing a non-volatile memory device, the method comprising:
connecting local word lines and global word lines of a selected block, respectively, in response to a block selection signal;
performing a first erase attempt of an erase operation by applying a first erase voltage to the global word line and a first bulk voltage higher than the first erase voltage to a bulk, so that a voltage difference between the local word line and the bulk is a first potential difference;
determining whether the first erase attempt has been performed properly; and
performing a second erase attempt of the erase operation if it is determined that the first erase attempt has not been performed properly by applying a second erase voltage to the global word line and a second bulk voltage to the bulk to increase the voltage difference between the local word line and the bulk to a second potential difference.

23. The method of claim 22, wherein the second erase voltage is less than the first erase voltage.

24. The method of claim 22, wherein the second bulk voltage is greater than the first bulk voltage.

25. The method of claim 22, wherein the first erase voltage and the second erase voltage are different, and the first bulk voltage and the second bulk voltage are different.

26. The method of claim 22, wherein the erase operation is stopped after a predetermined number of erase attempts have been performed unsuccessfully, wherein the selected block is flagged as an invalid block after the predetermined number of erase attempts has been performed unsuccessfully.

27. A method of controlling an erase operation of a flash memory device, the method comprising:
connecting local word lines and global word lines of a selected block, respectively, in response to a block selection signal;
performing an erase operation by applying a positive erase voltage to the global word lines and a bulk voltage higher than the erase voltage to a bulk of a memory cell according to an erase command;
determining whether the erase operation has been performed properly; and
if it is determined that the erase operation has not been performed properly, performing the erase operation again by controlling the erase voltage and the bull voltage at the same time so that a voltage difference between the local word lines and the bulk becomes great.

28. The method of claim 24, wherein the steps determining whether the erase operation has been performed properly or not are repeatedly performed as many as the number of times while the erase voltage is decreased as much as a predetermined level and the bulk voltage is increased as much as a predetermined level, and include treating a corresponding block as an invalid block if the erase operation has not been performed properly until the predetermined number.

29. The method of claim 27, wherein the erase voltage and the bulk voltage are set such that a voltage difference between the local word lines and the bulk is 15 V or higher.

30. The method of claim 27, wherein the erase voltage is decreased on a 0.1 to 0.5 V basis so that a voltage difference between the local word lines and the bulk is increased within a range in which the voltage difference becomes at least 15 V.

31. The method of claim 27, wherein the erase voltage is decreased as an exponential function so that a voltage difference between the local word lines and the bulk is increased within a range in which the voltage difference becomes at least 15 V.

32. The method of claim 27, wherein the erase voltage is increased on a 0.5 to 1 V basis so that a voltage difference between the local word lines and the bulk is increased within a range in which the voltage difference becomes at least 15 V.

33. The method of claim 27, wherein the erase voltage is increased as an exponential function so that a voltage difference between the local word lines and the bulk is increased within a range in which the voltage difference becomes at least 15 V.

* * * * *